United States Patent
Naeimi et al.

(10) Patent No.: US 9,747,967 B2
(45) Date of Patent: Aug. 29, 2017

(54) MAGNETIC FIELD-ASSISTED MEMORY OPERATION

(71) Applicant: INTEL CORPORATION, Santa Clara, CA (US)

(72) Inventors: Helia Naeimi, Santa Clara, CA (US); Shih-Lien L. Lu, Portland, OR (US); Shigeki Tomishima, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 14/499,067

(22) Filed: Sep. 26, 2014

(65) Prior Publication Data

US 2016/0093355 A1    Mar. 31, 2016

(51) Int. Cl.
*G11C 11/00* (2006.01)
*G11C 11/16* (2006.01)

(52) U.S. Cl.
CPC ........ *G11C 11/1675* (2013.01); *G11C 11/161* (2013.01); *G11C 11/1653* (2013.01); *G11C 11/1659* (2013.01); *G11C 11/1673* (2013.01)

(58) Field of Classification Search
CPC ............ G11C 11/1675; G11C 11/1653; G11C 11/1659; G11C 11/161
USPC ......................................... 365/148, 171, 173
See application file for complete search history.

(56) References Cited

U.S. PATENT DOCUMENTS

| | | |
|---|---|---|
| 5,732,016 A | 3/1998 | Chen et al. |
| 7,577,020 B2 * | 8/2009 | Chung ................ G11C 11/16 365/148 |
| 7,581,326 B1 | 9/2009 | Bulow et al. |
| 8,467,770 B1 | 6/2013 | Ayed |
| 8,615,799 B2 | 12/2013 | Henry et al. |

(Continued)

FOREIGN PATENT DOCUMENTS

| | | |
|---|---|---|
| TW | 200949681 | 12/2009 |
| TW | I391931 | 4/2013 |

(Continued)

OTHER PUBLICATIONS

U.S. Appl. No. 14/583,513, filed Dec. 26, 2014, entitled "Security Mode Data Protection", invented by H. Naeimi et al., 27 pp. [77.306 (Appln)].

(Continued)

*Primary Examiner* — Thao H Bui
(74) *Attorney, Agent, or Firm* — Konrad Raynes Davda & Victor LLP

(57) ABSTRACT

In one embodiment, a magnetoresistance random access memory (MRAM) such as a spin transfer torque (STT) random access memory (RAM), for example, has a subarray of bitcells and an electro-magnet positioned adjacent the subarray. A magnetic field is directed through a ferromagnetic device of bitcells of the first subarray to assist in the changing of states of bitcells of the subarray from a first state to a second state in which the ferromagnetic device of the bitcell is changed from one of parallel and anti-parallel polarization to the other of parallel and anti-parallel polarization. Accordingly, the content of the subarray may be readily preset or erased to one of the parallel or anti-parallel state with assistance from an electro-magnet. During a normal write operation, the bits to the other state are written. Other aspects are described herein.

19 Claims, 12 Drawing Sheets

(56) References Cited

U.S. PATENT DOCUMENTS

| | | | |
|---|---|---|---|
| 8,732,195 | B2 | 5/2014 | Skeen et al. |
| 9,131,381 | B1 | 9/2015 | Sobel |
| 2001/0033012 | A1 | 10/2001 | Kommerling et al. |
| 2003/0026040 | A1* | 2/2003 | Covington ............. B82Y 25/00 360/125.04 |
| 2003/0097596 | A1 | 5/2003 | Muratov et al. |
| 2005/0146912 | A1* | 7/2005 | Deak ...................... G11C 11/16 365/145 |
| 2006/0087882 | A1 | 4/2006 | Kinsley |
| 2006/0092690 | A1 | 5/2006 | Kim et al. |
| 2006/0140452 | A1 | 6/2006 | Raynor et al. |
| 2007/0055815 | A1 | 3/2007 | Lenssen et al. |
| 2008/0140967 | A1 | 6/2008 | Breslau et al. |
| 2008/0247098 | A1* | 10/2008 | Deak ................... G11C 11/1695 360/328 |
| 2009/0089526 | A1 | 4/2009 | Kuo et al. |
| 2009/0281809 | A1 | 11/2009 | Reuss |
| 2010/0146641 | A1 | 6/2010 | Lenssen et al. |
| 2010/0306519 | A1 | 12/2010 | Buonpane et al. |
| 2012/0110238 | A1 | 5/2012 | Blawat |
| 2012/0287709 | A1 | 11/2012 | Suguro |
| 2013/0028009 | A1 | 1/2013 | Kim et al. |
| 2013/0028011 | A1* | 1/2013 | Kitagawa ........... G11C 19/0808 365/158 |
| 2013/0242646 | A1 | 9/2013 | Katti et al. |
| 2014/0035617 | A1 | 2/2014 | Raychowdhury et al. |
| 2014/0160835 | A1 | 6/2014 | Soree et al. |
| 2014/0177326 | A1 | 6/2014 | Doyle et al. |
| 2014/0209892 | A1 | 7/2014 | Kuo et al. |
| 2016/0110537 | A1 | 4/2016 | Harrison |

FOREIGN PATENT DOCUMENTS

| | | |
|---|---|---|
| TW | I410797 | 10/2013 |
| TW | I410981 | 10/2013 |
| TW | I451248 | 9/2014 |
| WO | 0129755 | 4/2001 |

OTHER PUBLICATIONS

U.S. Appl. No. 14/583,518, filed Dec. 26, 2014, entitled "Event Triggered Erasure for Data Security", invented by H. Naeimi et al., 48 pp. [77.307 (Appln)].

Poole, I., "MRAM Memory Tutorial", [online], [Retrieved on Sep. 7, 2014], retrieved from the Internet at <URL: http://www.radio-electronics.com/info/data/semicond/memory/mram-memory-technology.php>, 5 pp.

Wikipedia, "Flash Memory", [online], last modified Aug. 20, 2014, [Retrieved on Aug. 26, 2014], retrieved from the Internet at <URL: http://en.wikipedia.org/wiki/Flash_Memory#Block_erasure>, 26 pp.

Wikipedia, "Spin-Transfer Torque", [online], last modified Jul. 30, 2014, [Retrieved on Aug. 26, 2014], retrieved from the Internet at <URL: http://en.wikipedia.org/wiki/Spin_torque_transfer>, 3 pp.

International Search Report and Written Opinion for International Application No. PCT/US2015/047014, dated Dec. 4, 2015, 11 pp. [77299PCT (ISR & WO)].

Wikipedia, "Radio-Frequency Identification", [online], last modified Oct. 14, 2014, [retrieved on Oct. 15, 2014], retrieved from the Internet at <URL: http://en.wikipedia.org/wiki/Radio-frequency_identification>, 27 pp.

Wikipedia, "Vacuum Permeability", [online], last modified May 5, 2014, [retrieved on Oct. 13, 2014], retrieved from the Internet at <URL: http://en.wikipedia.org/wiki/Vacuum_permeability>, 5 pp.

Office Action 1 for TW Application No. 104127715, dated Aug. 9, 2016, 35 pp. (W/ Engl Translation of Search Report and Claims) [77.299TW (OA1)].

Office Action 1 for U.S. Appl. No. 14/583,513, dated May 6, 2016, 24 pp. [77.306 (OA1)].

Response to Office Action 1 for U.S. Appl. No. 14/583,513, dated Aug. 8, 2016, 10 pp. [77.306 (ROA1)].

Office Action 2 for U.S. Appl. No. 14/583,513, dated Sep. 2, 2016, 19 pp. [77.306 (OA2)].

International Search Report for International Application No. PCT/US2015/062800, dated Apr. 22, 2016, 16 pp. [77.306PCT (ISR & WO)].

Office Action 1 for TW Application No. 104139139, dated Aug. 25, 2016, 18 pp. (W/ Engl Translation of Search Report and Claims) [77.306TW (OA1)].

Office Action 1 for U.S. Appl. No. 14/583,518, dated May 18, 2016, 23 pp. [77.307 (OA1)].

Response to Office Action 1 for U.S. Appl. No. 14/583,518, dated Aug. 15, 2016, 10 pp. [77.307 (ROA1)].

Final Office Action 1 for U.S. Appl. No. 14/583,518, dated Sep. 14, 2016, 25 pp. [77.307 (FOA1)].

International Search Report for International Application No. PCT/US2015/062802, dated Mar. 8, 2016, 14 pp. [77.307PCT (ISR & WO)].

U.S. Pat. No. 8,615,799, dated Dec. 24, 2013, is an English Language equivalent of TW Publication No. 200949681, dated Dec. 1, 2009.

Office Action and Search Report for TW Application No. 104139141, dated Dec. 13, 2016, 10 pp. (W/ English Language Translation of SR) [77.307TW (OA1 and SR)].

Response to Office Action 2 for U.S. Appl. No. 14/583,513, dated Jan. 3, 2017, 11 pp. [77.306 (ROA2)].

Response to Final Office Action 1 for U.S. Appl. No. 14/583,518, dated Dec. 14, 2016, 11 pp. [77.307 RFOA1)].

Office Action 3 for U.S. Appl. No. 14/583,518, dated Feb. 14, 2017, 19 pp. [77.307 (OA3)].

Second Response to Final Office Action 1 for U.S. Appl. No. 14/583,513, dated Jun. 9, 2017, 13 pp. [77.306 RFOA1-2)].

International Preliminary Report on Patentability (IPRP) for International Application No. PCT/US2015/047014, dated Apr. 6, 2017, 10 pp. [77.299PCT (IPRP)].

Final Office Action 1 for U.S. Appl. No. 14/583,513, dated Mar. 9, 2017, 23 pp. [77.306 (FOA1)].

Response to Final Office Action 1 for U.S. Appl. No. 14/583,513, dated May 9, 2017, 12 pp. [77.306 (RFOA1)].

Advisory Action for U.S. Appl. No. 14/583,513, dated May 18, 2017, 8 pp. [77.306 (AdvAct)].

Response to Office Action 3 for U.S. Appl. No. 14/583,518, dated May 14, 2017, 11 pp. [77.307 (ROA3)].

Final Office Action 2 for U.S. Appl. No. 14/583,518, dated Jun. 7, 2017, 20 pp. [77.307 (FOA2)].

International Preliminary Report on Patentability (IPRP) for International Application No. PCT/US2015/062800, dated Jul. 6, 2017, 13 pp. [77.306PCT (IPRP)].

International Preliminary Report on Patentability (IPRP) for International Application No. PCT/US2015/062802, dated Jul. 6, 2017, 10 pp. [77.306PCT (IPRP)].

* cited by examiner

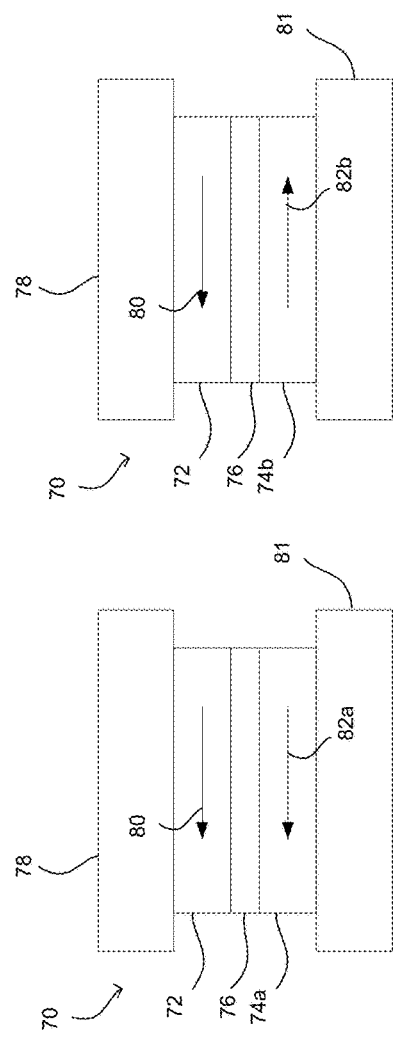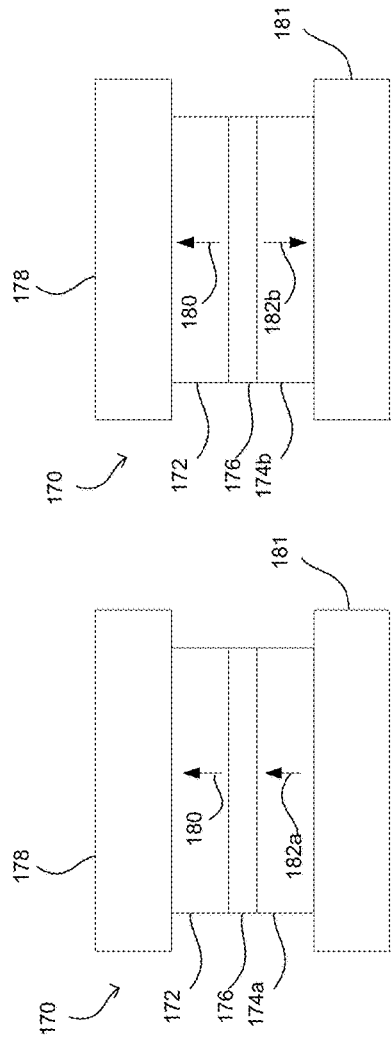

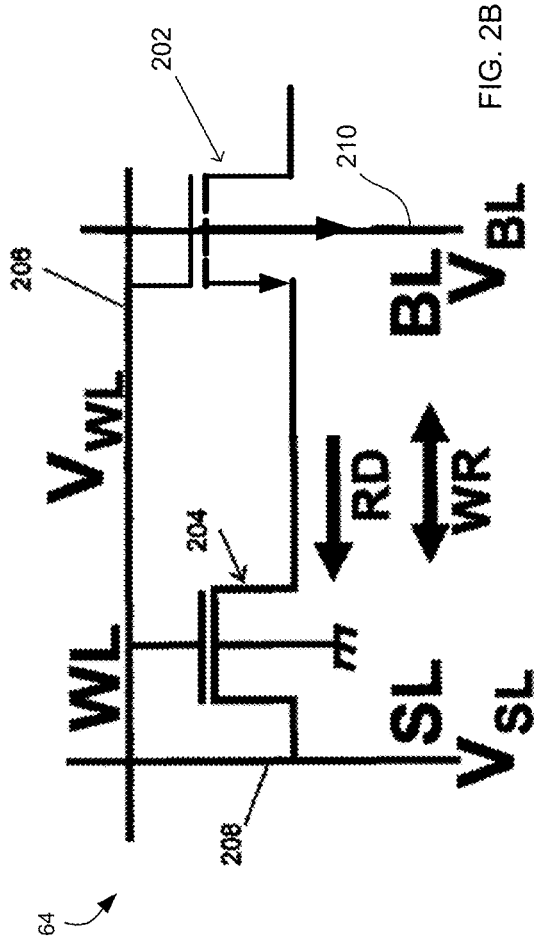
FIG. 2A
FIG. 2B
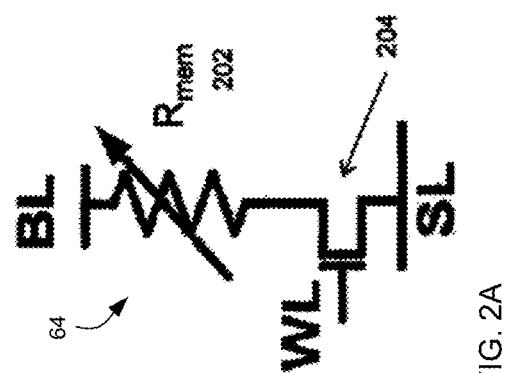
FIG. 3

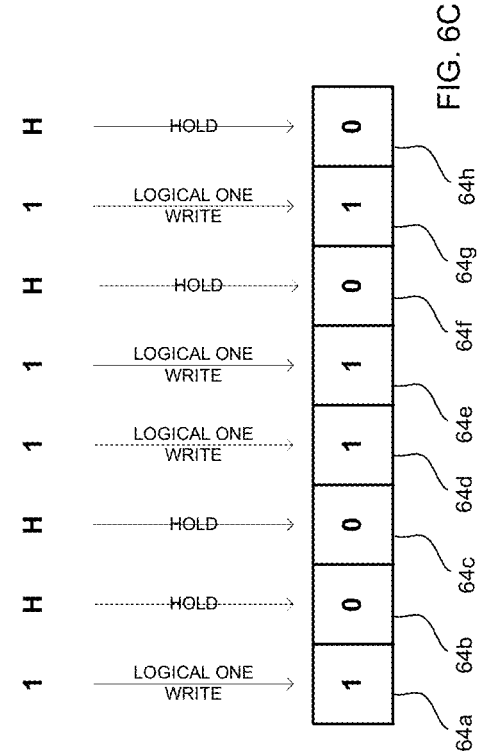
FIG. 6A
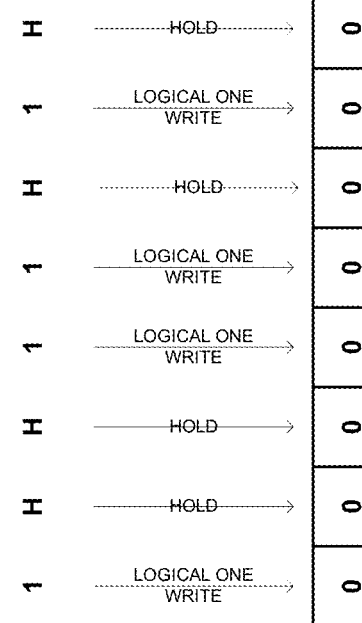
FIG. 6B
FIG. 6C

MAGNETIC FIELD-ASSISTED MEMORY OPERATION

TECHNICAL FIELD

Certain embodiments of the present invention relate generally to non-volatile memory.

BACKGROUND

Spin Transfer Torque Random Access Memory (STTRAM) is a type of magnetoresistive Random Access Memory (MRAM) which is non-volatile and is typically used for memory circuits, such as, cache, memory, secondary storage, and other memory applications. STTRAM memory may often be operated at reduced power levels and may be less expensive as compared to other memory types.

One problem encountered with STTRAM memory is that write operations to the STTRAM memory may be relatively long, as compared to read operations, thereby adversely affecting performance of the STTRAM memory. One approach to reducing the write time for STTRAM memory has been to reduce the persistence of the memory, that is, the length of time that each bit cell reliably maintains its logic state.

Other techniques are directed to improving efficiency of STTRAM memory. One such technique detects when a cell is switched and terminates the write operation for that cell to reduce excess current flowing through the ferromagnetic device.

Another type of non-volatile memory is flash memory in which the bitcells comprise NAND gates. Flash memories often have two operational modes, an erase mode in which a whole subarray is erased, and a set mode in which bits may then be set as needed.

BRIEF DESCRIPTION OF THE DRAWINGS

Embodiments of the present disclosure are illustrated by way of example, and not by way of limitation, in the figures of the accompanying drawings in which like reference numerals refer to similar elements.

FIGS. 1C-1F depict various polarizations of ferromagnetic layers of a bitcell of the STTRAM memory of FIG. 1B.

FIGS. 2A-2B depict a schematic of a typical one-transistor-one-resistor (1T1R) device showing the bit-line (BL), word-line (WL) and source line (SL).

FIG. 3 is a chart depicting read and write voltages for the one-transistor-one-resistor (1T1R) device of FIGS. 2A-2B.

FIG. 6A is a schematic representation of conversion of write data in preparation for a data write to bitcells of the STTRAM memory of FIG. 1B.

FIG. 6B is a schematic representation of presentation of converted write data in preparation for a data write to bitcells of the STTRAM memory of FIG. 1B.

FIG. 6C is a schematic representation of converted write data written to bitcells of the STTRAM memory of FIG. 1B.

DESCRIPTION OF EMBODIMENTS

Figure 1A:
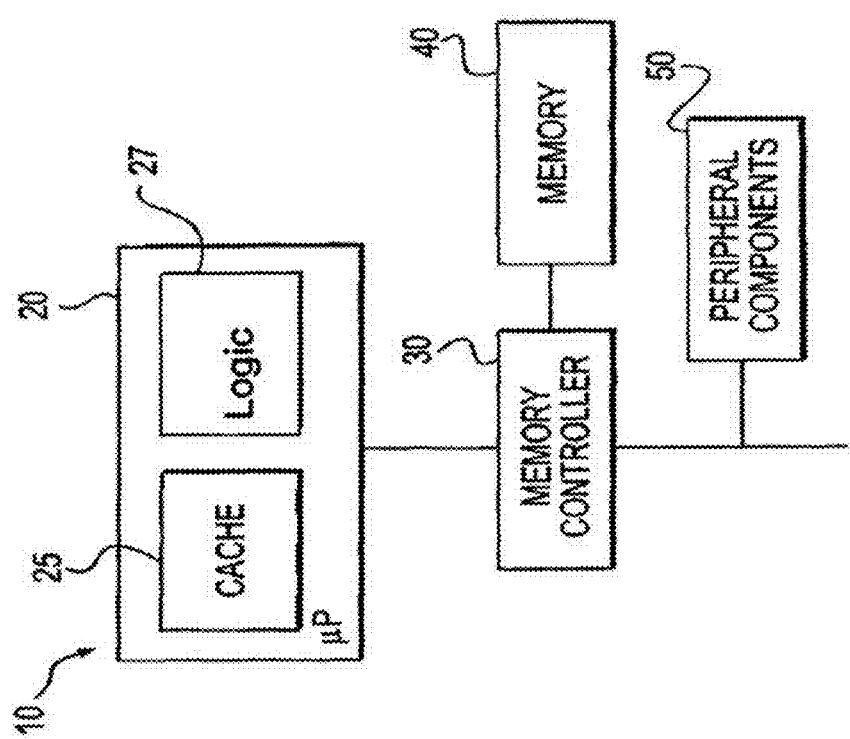
FIG. 1A depicts a high-level block diagram illustrating selected aspects of a system, in accordance with an embodiment of the present disclosure.

In the description that follows, like components have been given the same reference numerals, regardless of whether they are shown in different embodiments. To illustrate an embodiment(s) of the present disclosure in a clear and concise manner, the drawings may not necessarily be to scale and certain features may be shown in somewhat schematic form. Features that are described and/or illustrated with respect to one embodiment may be used in the same way or in a similar way in one or more other embodiments and/or in combination with or instead of the features of the other embodiments.

In accordance with various embodiments of this disclosure, a magnetic field-assisted MRAM memory such as an STT memory is described. STT is an effect in which the orientation of a magnetic layer in a magnetic tunnel junction (MTJ) device can be modified using a spin-polarized current. In STT-based MTJs, device resistance can be either low or high, depending on the relative angular difference between the directions of magnetic polarization on both sides of the tunnel junction.

In one embodiment, a magnetic field is directed through a ferromagnetic layer of an MTJ device of each bitcell of a subarray of bitcells to facilitate a state change of each MTJ from a first state to a second state. In one embodiment, the first state is one in which the ferromagnetic layers of the each MTJ have a parallel magnetic orientation and exhibit low resistance. Conversely, the second state is one in which the ferromagnetic layers of each MTJ have an anti-parallel magnetic orientation and exhibit high resistance. It is believed that the magnetic assistance provided by the magnetic field directed through the MTJ, can facilitate the change in state from the first (parallel orientation, low resistance) state to the second (anti-parallel, high resistance) state. As explained in greater detail below, it is believed that such magnetic assistance can reduce write times of the STT memory in some embodiments.

For example, the content of the subarray may be readily preset or erased to one of the parallel or anti-parallel state with assistance from an electro-magnet. During a normal write operation, the bits to the other state are written.

It is appreciated that magnetic field-assistance techniques as described herein may be applied to MRAM devices other than STT MRAM devices such as giant magnetoresistance (GMR) MRAM, toggle MRAM and other MRAM devices. Such MRAM-based memory elements in accordance with embodiments described herein can be used either in stand-alone memory circuits or logic arrays, or can be embedded in microprocessors and/or digital signal processors (DSPs). Additionally, it is noted that although systems and processes are described herein primarily with reference to microprocessor based systems in the illustrative examples, it will be appreciated that in view of the disclosure herein, certain aspects, architectures, and principles of the disclosure are equally applicable to other types of device memory and logic devices.

Turning to the figures, FIG. 1A is a high-level block diagram illustrating selected aspects of a system implemented, according to an embodiment of the present disclosure. System 10 may represent any of a number of electronic and/or computing devices, that may include a memory device. Such electronic and/or computing devices may include computing devices such as a mainframe, server, personal computer, workstation, telephony device, network appliance, virtualization device, storage controller, portable or mobile devices (e.g., laptops, netbooks, tablet computers, personal digital assistant (PDAs), portable media players, portable gaming devices, digital cameras, mobile phones, smartphones, feature phones, etc.) or component (e.g. system on a chip, processor, bridge, memory controller, memory, etc.). In alternative embodiments, system 10 may include more elements, fewer elements, and/or different elements. Moreover, although system 10 may be depicted as comprising separate elements, it will be appreciated that such elements may be integrated on to one platform, such as systems on a chip (SoCs). In the illustrative example, system 10 comprises a microprocessor 20, a memory controller 30, a memory 40 and peripheral components 50 which may include, for example, video controller, input device, output device, storage, network adapter, etc. The microprocessor 20 includes a cache 25 that may be part of a memory hierarchy to store instructions and data, and the system memory 40 may also be part of the memory hierarchy. Communication between the microprocessor 20 and the memory 40 may be facilitated by the memory controller (or chipset) 30, which may also facilitate in communicating with the peripheral components 50.

Storage of the peripheral components 50 may be, for example, non-volatile storage, such as solid-state drives magnetic disk drives, optical disk drives, a tape drive, flash memory, etc.). The storage may comprise an internal storage device or an attached or network accessible storage. The microprocessor 20 is configured to write data in and read data from the memory 40. Programs in the storage are loaded into the memory and executed by the processor. A network controller or adapter enables communication with a network, such as an Ethernet, a Fiber Channel Arbitrated Loop, etc. Further, the architecture may, in certain embodiments, include a video controller configured to render information on a display monitor, where the video controller may be embodied on a video card or integrated on integrated circuit components mounted on a motherboard or other substrate. An input device is used to provide user input to the processor, and may include a keyboard, mouse, pen-stylus, microphone, touch sensitive display screen, input pins, sockets, or any other activation or input mechanism known in the art. An output device is capable of rendering information transmitted from the processor, or other component, such as a display monitor, printer, storage, output pins, sockets, etc. The network adapter may embodied on a network card, such as a Peripheral Component Interconnect (PCI) card, PCI-express, or some other I/O card, or on integrated circuit components mounted on a motherboard or other substrate.

One or more of the components of the device 10 may be omitted, depending upon the particular application. For example, a network router may lack a video controller, for example.

Figure 1B:
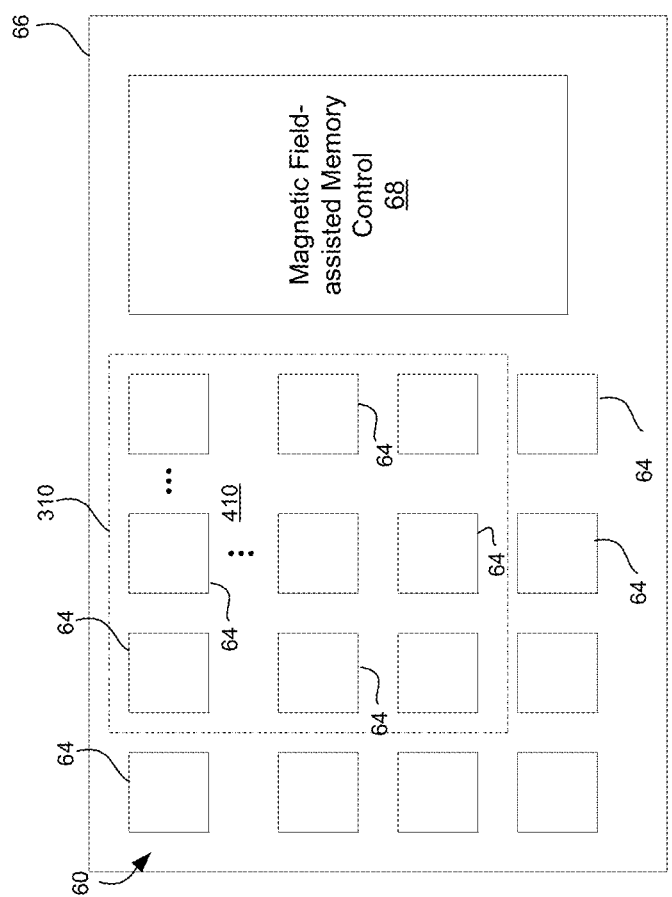
FIG. 1B depicts a basic architecture of an STTRAM memory in accordance with an embodiment of the present disclosure.

Any one or more of the memory devices 25, 40, and the other devices 10, 30, 50 may include magnetic assisted MRAM memory in accordance with the present description. FIG. 1B shows an example of an array 60 of rows and columns of bitcells 64 of an STT memory 66 in accordance with one embodiment of the present description. The STT memory 66 may also include a row decoder, a timer device and I/O devices (or I/O outputs). Bits of the same memory word may be separated from each other for efficient I/O design. A multiplexer (MUX) may be used to connect each column to the required circuitry during a READ operation. Another MUX may be used to connect each column to a write driver during a WRITE operation. A control circuit 68 performs read operations, write operations and magnetic field-assisted write operations to the bitcells 64 as explained below. The control circuit 68 is configured to perform the described operations using appropriate hardware, software or firmware, or various combinations thereof.

Each bitcell 64 of the array 60 of bitcells 64 includes a ferromagnetic device 70 (FIG. 1C) such as a spin valve, or a magnetic tunnel junction (MTJ) device. Each ferromagnetic device 70 of a bitcell comprises two layers 72, 74*a* of ferromagnetic material separated by an intermediate layer 76 which is a metallic layer in the case of a spin valve or is a thin dielectric or insulating layer in the case of an MTJ. In this example, the layer 72 of ferromagnetic material is contacted by an electrical contact layer 78 and has a fixed polarization in which the magnetization direction which predominates, is fixed. Hence, the layer 72 is referred to as the fixed layer. The predominant magnetization direction of the fixed layer 72 has a magnetization direction represented by an arrow 80 pointing from right to left in the cross-sectional view of FIG. 1C.

The other layer 74*a* of ferromagnetic material is contacted by an electrical contact layer 81 and is referred to as the "free layer" which has a changeable polarization in which the predominant magnetization direction of the free layer may be selectively changed. The predominant magnetization direction of the free layer 74*a* is represented by an arrow 82*a* which also points from right to left in the cross-sectional view of FIG. 1C.

In the example of FIG. 1C, the predominant magnetization directions of both the free and fixed layers 74*a*, 72 are depicted as being the same, that is in the same direction. If the predominant magnetization directions of the two ferromagnetic layers 72, 74*a* are the same, the polarizations of the two layers are referred to as being "parallel." In the parallel polarization, the bitcell exhibits a low resistance state which may be selected to represent one of a logical one or a logical zero stored in the bitcell. If the predominant magnetization directions of the two ferromagnetic layers are opposite as shown by the arrows 80 (right to left) and 82b (left to right) in FIG. 1D, the polarizations of the two layers 72, 74b are referred to as being "anti-parallel." In the anti-parallel polarization, the bitcell exhibits a high resistance state which may be selected to represent the other one of a logical one or a logical zero stored in the bitcell.

The polarization and hence the logical bit value stored in a bitcell 64 of an STTRAM 66 may be set to a particular state by passing a spin polarized current in a particular direction through the ferromagnetic device 70 of the bitcell 64. A spin polarized current is one in which the spin orientations of the charge carriers (such as electrons) are predominantly of one type, either spin up or spin down. Thus, the control circuit 68 (FIG. 1B) is configured to store a logical one in a bitcell 64 of an STTRAM 66 by passing spin polarized current in one direction through the ferromagnetic device 70 of the bitcell 64. As a result, the ferromagnetic layers of the ferromagnetic device 70 of the bitcell 64 have a polarization which is one of parallel or antiparallel, depending upon which polarization state has been selected to represent a logical one.

Conversely, a logical zero may be stored in a bitcell 64 of an STTRAM 66 by the control circuit 68 passing spin polarized current in the opposite direction through the ferromagnetic device 70 of the bitcell. As a result, the ferromagnetic layers of the ferromagnetic device 70 of the bitcell 64 have a polarization which is the other of parallel or antiparallel, depending upon which polarization has been selected to represent a logical zero.

FIGS. 1E and 1F depict an alternative embodiment of a ferromagnetic device. Here, each bitcell 64 of the array 60 of bitcells 64 includes a ferromagnetic device 170 (FIG. 1E) such as a spin valve, or a magnetic tunnel junction (MTJ) device. Each ferromagnetic device 170 of a bitcell comprises two layers 172, 174a of ferromagnetic material separated by an intermediate layer 176 which is a metallic layer in the case of a spin valve or is a thin dielectric or insulating layer in the case of an MTJ. In this example, the layer 172 of ferromagnetic material is contacted by an electrical contact layer 178 and has a fixed polarization in which the magnetization direction which predominates, is fixed. This fixed layer is usually much thicker than the free layer. Hence, the layer 172 is referred to as the fixed layer. The predominant magnetization direction of the fixed layer 172 is represented by an arrow 180 pointing from bottom to top in the cross-sectional view of FIG. 1E.

The other layer 174a of ferromagnetic material is contacted by an electrical contact layer 181 and is referred to as the "free layer" which has a changeable polarization in which the predominant magnetization direction of the free layer may be selectively changed. The predominant magnetization direction of the free layer 174a is represented by an arrow 182a which also points from bottom to top in the cross-sectional view of FIG. 1E.

In the example of FIG. 1E, the predominant magnetization directions of both the free and fixed layers 174a, 172 are depicted as being the same, that is in the same direction. If the predominant magnetization directions of the two ferromagnetic layers 172, 174 are the same, the polarizations of the two layers are referred to as being "parallel." In the parallel polarization, the bitcell exhibits a low resistance state which may be selected to represent one of a logical one or a logical zero stored in the bitcell. If the predominant magnetization directions of the two ferromagnetic layers are opposite as shown by the arrows 180 (bottom to top) and 182b (top to bottom) in FIG. 1F, the polarizations of the two layers 172, 174b are referred to as being "anti-parallel." In the anti-parallel polarization, the bitcell exhibits a high resistance state which may be selected to represent the other one of a logical one or a logical zero stored in the bitcell.

The polarization and hence the logical bit value stored in a bitcell 64 of an STTRAM 66 may be set to a particular state by the control circuit 68 which is configured to pass a spin polarized current in a particular direction through the ferromagnetic device 170 of the bitcell 64. Thus, a logical one may be stored in a bitcell 64 of an STTRAM 66 by passing spin polarized current in one direction through the ferromagnetic device 170 of the bitcell 64. As a result, the ferromagnetic layers of the ferromagnetic device 170 of the bitcell 64 have a polarization which is one of parallel and antiparallel, depending upon which polarization has been selected to represent a logical one.

Conversely, a logical zero may be stored in a bitcell 64 of an STTRAM 66 by the control circuit 68 passing spin polarized current in the opposite direction through the ferromagnetic device 170 of the bitcell. As a result, the ferromagnetic layers of the ferromagnetic device 170 of the bitcell 64 have a polarization which is the other of parallel and antiparallel, depending upon which polarization has been selected to represent a logical zero.

STTRAM uses a special write mechanism based on spin polarization current induced magnetization switching. FIGS. 2A-2B show schematics of the basic elements of a typical STTRAM bit cell 64, comprising a switching transistor 204 and a variable resistive transistor element $R_{mem}$ (element 202). The combined structure is frequently referred to as a 1T1R (one transistor one resistor) cell. Bit-line (BL, element 210), word line (WL, element 206), and source-line or select line (SL, element 208) for the bitcell are shown more prominently in FIG. 2B, with corresponding voltages, $V_{BL}$, $V_{WL}$, and $V_{SL}$ respectively. The transistor 204 acts as a selector switch, while the resistive element 202 may be a magnetic tunnel junction (MTJ) device such as the device 70 (FIG. 1C, 1D), comprising two soft ferromagnetic layers 72, 74a (or 74b), layer 72 having a fixed 'reference' magnetization direction 80, and the other having a variable magnetization direction 82a, 82b, separated by a junction layer 76. FIG. 2B shows while there is only one read direction (the arrow labeled RD), the write operation can be bi-directional (the double-headed arrow labeled WR). Therefore, this 1T1R structure can be described as a 1T-1STT MTJ memory cell with unipolar 'read' and bipolar 'write.'

The bitcell 64 is read by precharging the bit line BL to $V_{RD}$ and allowing it to decay through the cell when the write line WL is strobed with the voltage $V_{cc}$, as shown in the chart of FIG. 3, which turns on the switching transistor 204. A reference voltage $V_{BL}$, which is simultaneously drained using a reference cell, acts as the sense amplifier reference. Both the reference and the accessed BLs are clamped using a PMOS current source, so that a constant differential is maintained at the sense amplifier input even for very long access times.

In this example, a logical zero is represented by a high resistance state (antiparallel polarization (FIG. 1D, 1F) of the variable resistive transistor element $R_{mem}$ (element 202) which is the magnetic tunnel junction (MTJ) device 70, 170. Conversely a logical one is represented in this example by a low resistance state (parallel polarization (FIG. 1C, 1E) of the variable resistive transistor element $R_{mem}$ (element 202) which is the magnetic tunnel junction (MTJ) device 70, 170. Accordingly, if the precharge voltage $V_{RD}$ decays to a relatively high value, a logical 0 (high resistance state) is indicated as being stored in the MTJ device 70, 170. Conversely, if the precharge voltage $V_{RD}$ decays to a relatively low value, a logical 1 (low resistance state) is indicated as being stored in the MTJ device 70, 170. (It is appreciated that in other embodiments, a logical 0 may be represented by a low resistance state (parallel polarization (FIG. 1C, 1E) of the variable resistive transistor element $R_{mem}$ (element 202). Conversely a logical 1 may be represented by a high resistance state (anti-parallel polarization (FIG. 1D, 1F) of the variable resistive transistor element $R_{mem}$ (element 202).)

To write into the bitcell 64, a bidirectional writing scheme controlled by the control circuit 68 (FIG. 1B) is used. To write a logical 1 in which the state of the variable resistive transistor element $R_{mem}$ (element 202) changes from the anti-parallel state (FIG. 1D, 1F) to the parallel state (FIG. 1C, 1D), bit line BL is charged to $V_{cc}$ and select line SL is connected to ground so that a current is flowing from the bit line BL to the select line SL. Conversely, to write a logical 0 in which the state of the variable resistive transistor element $R_{mem}$ (element 202) changes from the parallel state (FIG. 1C, 1E) to the anti-parallel state (FIG. 1D, 1F), a current with opposite direction is utilized. Accordingly, select line SL at $V_{cc}$ and bit line BL at ground causes current to flow from the select line SL to the bit line BL, the opposite direction.

It is appreciated herein that changing the magnetic polarization of the bitcell 64 from one state to the other state is asymmetrical. More specifically, it is appreciated that the write time to change the state of the bitcell 64 from the parallel state (FIG. 1C, 1E) to the anti-parallel state (FIG. 1D, 1F) can in some instances be substantially longer than the write time for the converse, that is, the write time to change the state of the bitcell 64 from the anti-parallel state (FIG. 1D, 1F) to the parallel state (FIG. 1C, 1E). For example, in some instances the write time for the parallel to anti-parallel state change may be an order of magnitude greater than that for the write time for the anti-parallel to parallel state change.

Figure 4A:
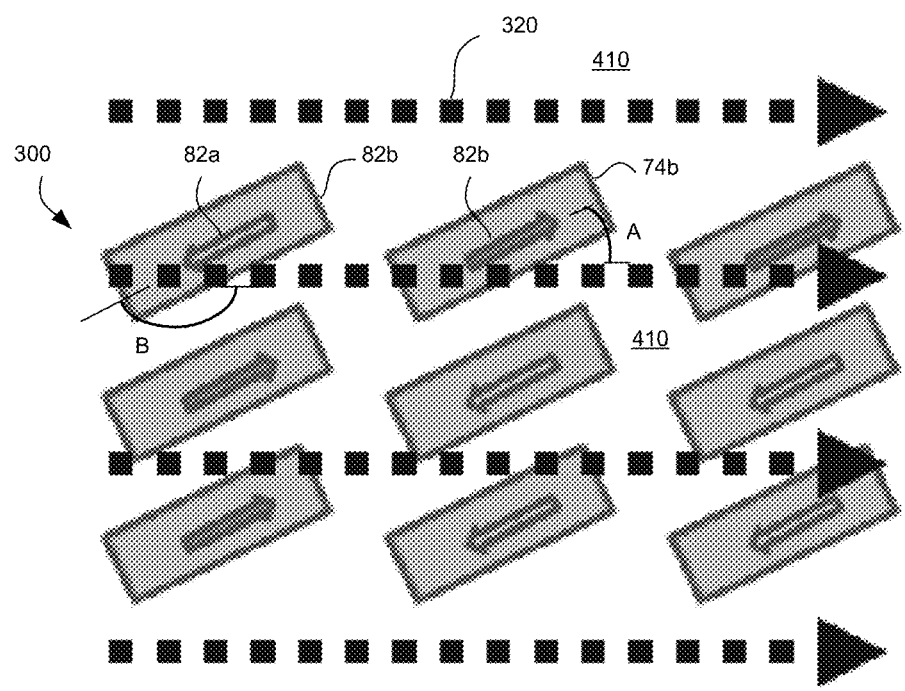
FIG. 4A is a schematic representation of directing a magnetic field through ferromagnetic layers of a subarray of bitcells of the STTRAM memory of FIG. 1B in accordance with an embodiment of the present disclosure. In this figure arrows represent a polarization of the "free layers" as explained below.

In accordance with one aspect of the present description it is appreciated that the write time for the parallel to anti-parallel state change may be substantially reduced by directing a magnetic field through the bitcell 64 as the appropriate write current is directed through the bitcell to change its state from the parallel state to the anti-parallel state. FIG. 4A is a schematic representation of a subarray 300 of free ferromagnetic layers 74a, 74b of the MTJ devices 70 (FIG. 1C, 1D) of a subarray 310 (FIG. 1B) of bitcells 64 of the array 60. A magnetic field as represented by the magnetic field lines 320 is directed through the free layers 74a, 74b of the MTJ devices 70 (FIG. 1C, 1D) of the subarray 310 (FIG. 1B) of bitcells 64 of the array 60. In the illustrated embodiment, the magnetic field 320 is in substantial parallel alignment with the magnetization direction of the antiparallel polarized ferromagnetic layers 74b (FIG. 1D) as represented by the arrows 82b. By substantial parallel alignment, it is meant that the angular difference A between the field lines of the magnetic field 320 passing through the bitcells of the subarray 310, and the magnetization direction 82b of the free ferromagnetic layers 74b of the antiparallel polarization is within a range of 0-90 degrees, such as approximately 45 degrees in one embodiment.

Conversely, in the illustrated embodiment, the magnetic field 320 is in substantial anti-parallel alignment with the magnetization direction of the parallel polarized ferromagnetic layers 74a (FIG. 1C) as represented by the arrows 82a.

By substantial anti-parallel alignment, it is meant that the angular difference B between the field lines of the magnetic field 320 passing through the bitcells of the subarray 310, and the magnetization direction 82a of the free ferromagnetic layers 74a of the parallel polarization is within a range of 90-180 degrees, such as approximately 135 degrees, in one embodiment. Such an arrangement is believed to facilitate a state change from parallel polarization (FIG. 1C) to anti-parallel polarization (FIG. 1D) such the write current may be reduced, or the write time reduced, or both when changing the polarization state from the parallel polarization state to the anti-parallel polarization state of the MTJ device 70 of each bitcell 64 through which the magnetic field 320 is directed.

Figure 4B:
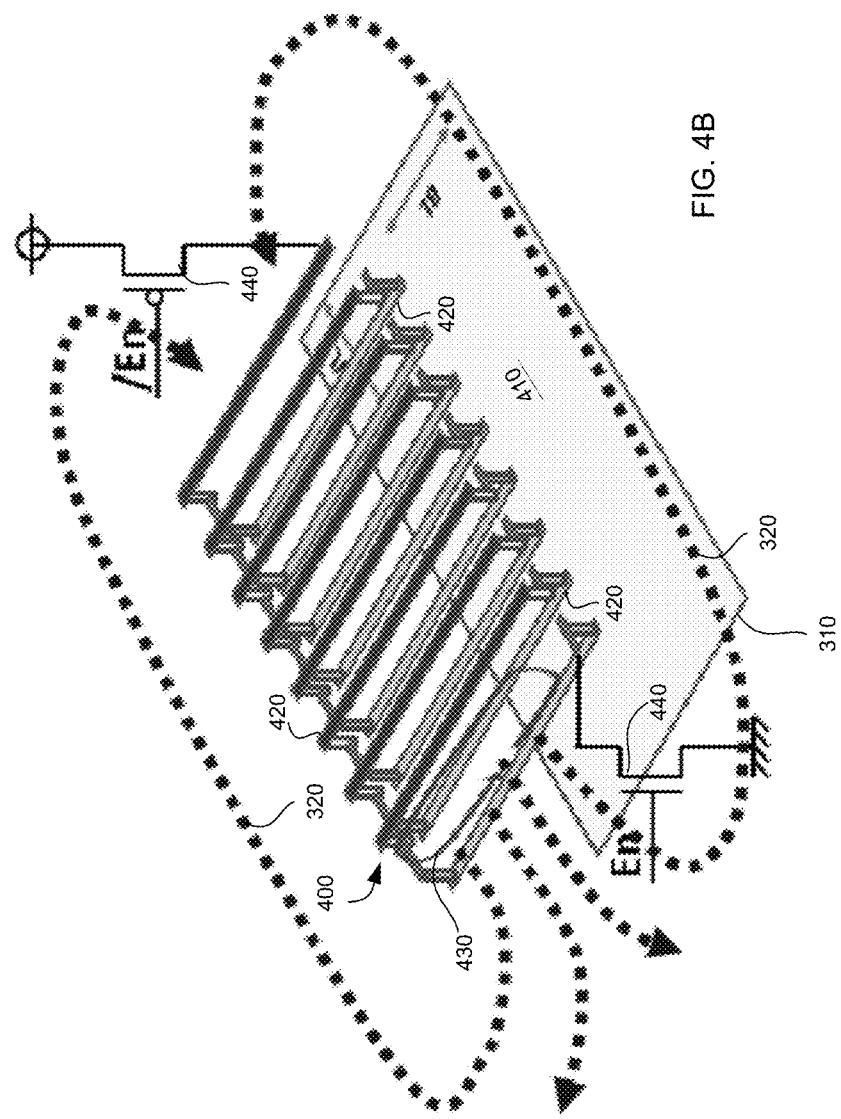
FIG. 4B is a schematic representation of a coil disposed over a subarray of bitcells of the STTRAM memory of FIG. 1B for directing a magnetic field through the subarray of bitcells in accordance with an embodiment of the present disclosure.

FIG. 4b shows an example of a multi-turn electro-magnet coil 400 of an disposed over the subarray 310 of bitcells 64 (FIG. 1B) of the memory array 60. The subarray 310 of bitcells 64 (FIG. 1B) defines a plane 410, and in this embodiment, each turn 420 of the coil 400 is positioned orthogonal to the bitcell plane 410 so that the field lines 320 of the magnetic field are directed through the bitcells of the subarray 310 in substantial alignment with the bitcell plane 410. By substantial alignment, it is meant that the angular difference between the bitcell plane 410 and the field lines of the magnetic field 320 passing through the bitcell subarray 310 is within a range of 45 to −45 degrees, such as approximately 0 degrees, in one embodiment.

The multi-turn coil 400 may be fabricated using a variety of techniques. One such technique forms the multi-turn coil using metallization layers, vias and lateral conduits. Other techniques may form the multi-turn coil using other conductive materials such as doped semiconductor materials. In the illustrated embodiment, each turn 420 is formed of spaced conductive layers which are linked with spaced conductive vias. Adjacent turns are linked with spaced lateral conduits. Yet another technique for fabricating the multi-turn coil may include metallization and through silicon vias (TSVs) that are frequently used for three dimensional integrated circuit stacking. It is appreciated that a suitable coil may have fewer or a greater number of turns, may have other shapes and other positions, depending upon the particular application.

To generate the magnetic field 320, a drive current is passed through the turns 420 of the electro-magnet coil 400 in a counter-clockwise direction as indicated by the arrow 430. A magnetic field directed in the opposite direction may be generated by passing a drive current through the turns 420 of the coil 400 in a clockwise direction. The drive current may be selectively switched on and off by the control circuit 68 (FIG. 1B) which is configured to provide appropriate enable signals (En, En (bar)) to switching transistors 440. In the illustrated embodiment, the drive current to the coil 400 may be switched on to at least partially coincide with the write current switching the bitcells of the subarray 310 from the parallel polarization state to the antiparallel polarization state to provide magnetic assistance to the state change.

Figure 5A:
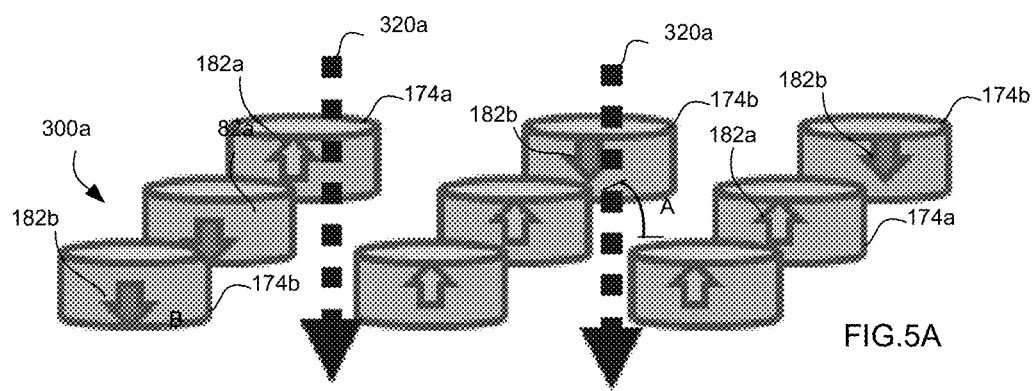
FIG. 5A is a schematic representation of an alternative embodiment of directing a magnetic field through ferromagnetic layers of a subarray of bitcells of the STTRAM memory of FIG. 1B in accordance with an embodiment of the present disclosure. Again, in this figure arrows represent a polarization of the "free layers" as explained below.
Figure 5B:
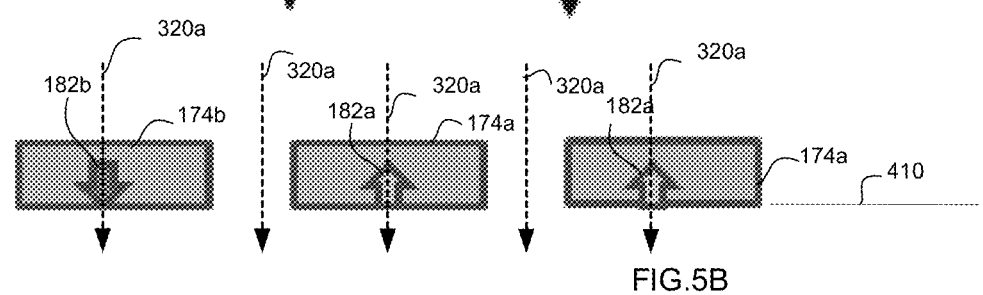
FIG. 5B is a schematic representation of a cross-sectional view of the subarray of the magnetic field and free ferromagnetic layers of FIG. 5A.

FIG. 5A and the cross-sectional view of FIG. 5B are a schematic representation of an alternative embodiment of a subarray 300a of free ferromagnetic layers 174a, 174b of the MTJ devices 170 (FIG. 1E, 1F) of a subarray 310 (FIG. 1B) of bitcells 64 of the array 60. A magnetic field as represented by the magnetic field lines 320a is directed through the free layers 174a, 174b of the MTJ devices 170 (FIG. 1E, 1F) of the subarray 310 (FIG. 1B) of bitcells 64 of the array 60. In the illustrated embodiment, the magnetic field 320a is generally orthogonal to the bitcell plane 410 (FIG. 1B) and is in substantially parallel alignment with the magnetization direction of the antiparallel polarized ferromagnetic layers 174b (FIG. 1F) as represented by the arrows 182b. By substantial parallel alignment, it is meant that the angular difference between the field lines of the magnetic field 320a passing through the bitcells of the subarray 300a, and the magnetization direction 182b of the free ferromagnetic layers 174b of the antiparallel polarization is within a range of 45 to −45 degrees, in one embodiment. In the embodiment depicted in FIGS. 5A, 5B, the angular difference between the field lines of the magnetic field 320a passing through the bitcells of the subarray 310, and the magnetization direction 182b of the free ferromagnetic layers 174b of the antiparallel polarization is substantially zero.

Conversely, in the illustrated embodiment, the magnetic field 320a is in substantial anti-parallel alignment with the magnetization direction of the parallel polarized ferromagnetic layers 174a (FIG. 1E) as represented by the arrows 182a. By substantial anti-parallel alignment, it is meant that the angular difference between the field lines of the magnetic field 320 and the magnetization direction 182a of the free ferromagnetic layers 174a of the parallel polarization is within a range of 135 to 225 degrees, in one embodiment. In the embodiment depicted in FIG. 5A, 5B, the angular difference between the field lines of the magnetic field 320a passing through the bitcells of the subarray 310, and the magnetization direction 182a of the free ferromagnetic layers 174b of the parallel polarization is substantially 180 degrees. Such an arrangement is believed to facilitate a state change from parallel polarization (FIG. 1E) to anti-parallel polarization (FIG. 1F) such the write current may be reduced, or the write time reduced, or both when changing the polarization state from the parallel polarization state to the anti-parallel polarization state of the MTJ device 170 of each bitcell 64 through which the magnetic field 320a is directed.

Figure 5C:
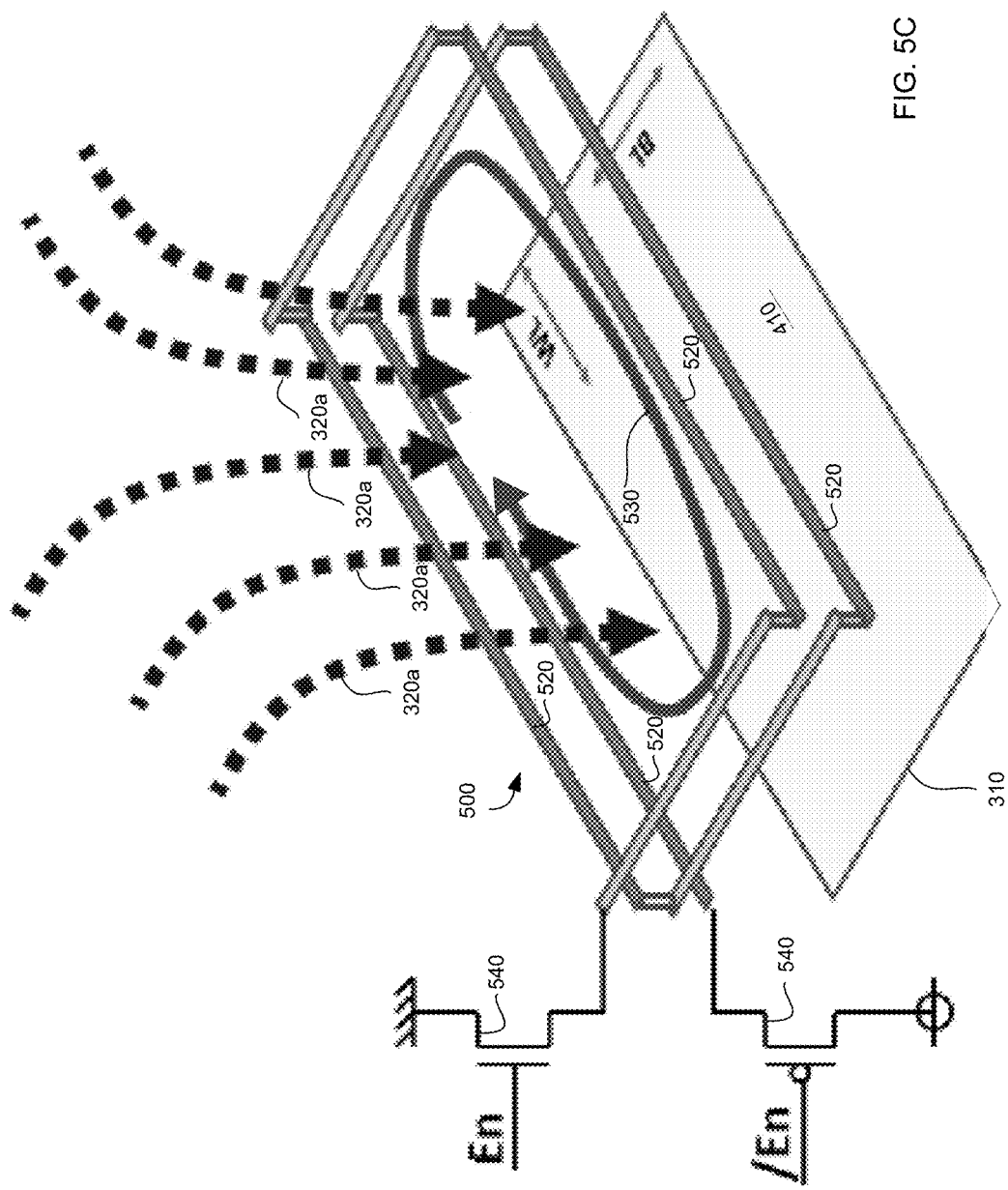
FIG. 5C is a schematic representation of an alternative embodiment of a coil disposed over a subarray of bitcells of the STTRAM memory of FIG. 1B for directing a magnetic field through the subarray of bitcells in accordance with an embodiment of the present disclosure.

FIG. 5C shows an example of a multi-turn electromagnet coil 500 disposed over the subarray 310 of bitcells 64 (FIG. 1B) of the memory array 60. The subarray 310 of bitcells 64 (FIG. 1B) defines a plane 410, and in this embodiment, each turn 520 of the coil 500 is positioned parallel to the bitcell plane 410 so that the field lines 320a of the magnetic field are directed substantially orthogonally through the bitcell plane 410 of the bitcells of the subarray 310. By substantially orthogonal, it is meant that the angular difference between the bitcell plane 410 and the field lines of the magnetic field 320a passing through the bitcell subarray 310 is greater than 45 degrees, in one embodiment. In another embodiment, the angular difference between the bitcell plane 410 and the field lines of the magnetic field 320a passing through the bitcell subarray 310 is approximately 90 degrees.

The multi-turn coil 500 may be fabricated using a variety of techniques. One such technique forms the multi-turn coil using metallization layers, vias and lateral conduits. Other techniques may form the multi-turn coil using other conductive materials such as doped semiconductor materials. In the illustrated embodiment, each turn 520 is formed of spaced conductive layers which are linked with spaced conductive vias and spaced lateral conduits. Adjacent turns are linked with spaced vias. Yet another technique for fabricating the multi-turn coil may include metallization and through silicon vias (TSVs) that are frequently used for three dimensional integrated circuit stacking. It is appreciated that a suitable coil may have fewer or a greater number of turns, may have other shapes and other positions, depending upon the particular application.

Figure 5D:
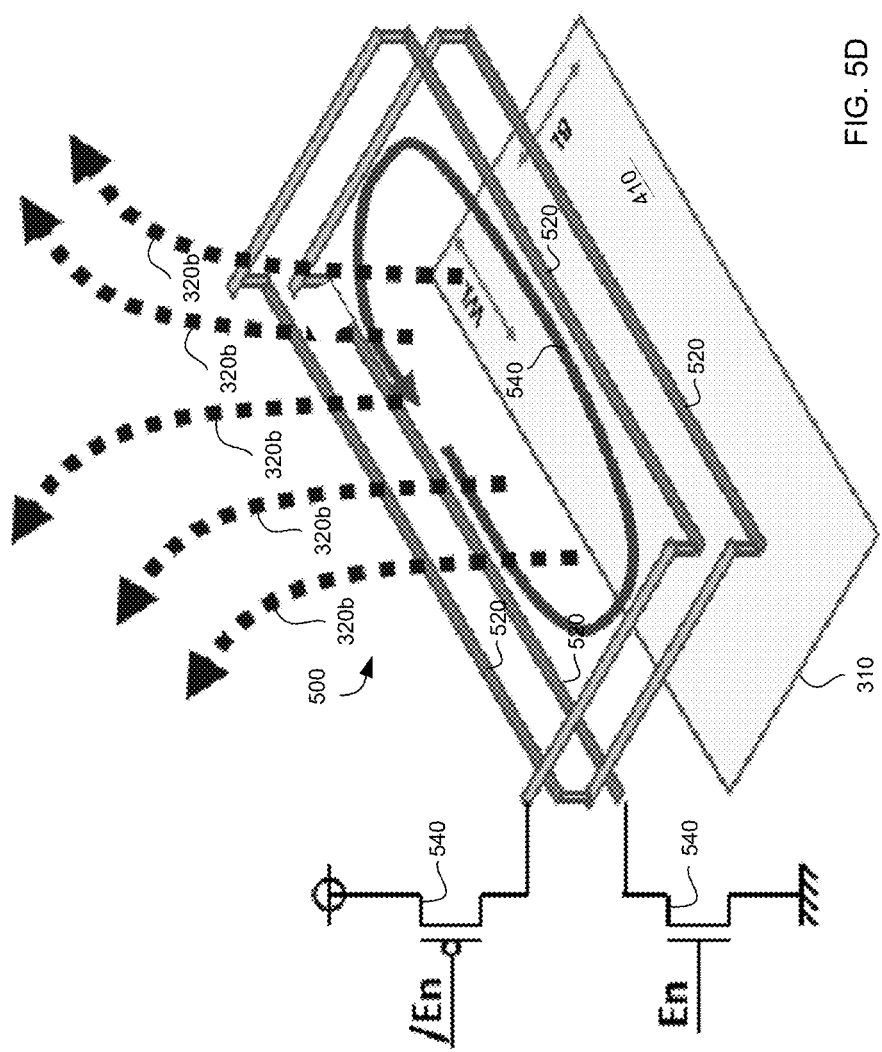
FIG. 5D is a schematic representation of an alternative embodiment of the coil of FIG. 5C.

To generate the magnetic field 320a, a drive current is passed through the turns 520 of the coil 500 in a clockwise direction as indicated by the arrow 530. A magnetic field 320b (FIG. 5D) directed in the opposite direction may be generated by passing a drive current 540 through the turns 520 of the coil 500 in a counter-clockwise direction. The drive current may be selectively switched on and off by the control circuit 68 (FIG. 1B) which is configured to provide appropriate enable signals (En, En (bar)) to switching transistors 540. In the illustrated embodiment, the drive current to the coil 500 may be switched on to at least partially coincide with the write current switching the bitcells of the subarray 310 from the parallel polarization state to the antiparallel polarization state to provide magnetic assistance to the state change.

In the examples described above, bitcells 64 (FIG. 1B) of an entire subarray 310 may be switched together from the parallel polarization state (FIGS. 1C, 1E) to the anti-parallel polarization state (FIGS. 1D, 1F) using the magnetic assistance provided by the associated magnetic field 320, 320a, 320b. For simplicity sake, the subarray 310 of FIG. 1B is depicted as including a 3 by 3 subarray of bitcells. It is appreciated that the number of bitcells for which an assistive magnetic field may be used to switch at one time the respective polarization states from the parallel to antiparallel polarizations, may vary, depending upon the particular application. In that modern memories often have the capacity to store many gigabytes (or more) of data, the subarray 310 may include one bitcell, or may include tens, hundreds, thousands, tens of thousands or more bitcells for which their respective polarization states are switched from the parallel to anti-parallel polarizations at one time using magnetic assistance as described herein.

In the illustrated embodiment, the anti-parallel polarization, high-resistance state, is selected to represent a logical zero stored in the bitcell. Accordingly, logical zeroes may be written into each bitcell of the subarray 310, effectively "erasing" any data stored in the subarray 310. Any bitcells which were already in the anti-parallel polarization, high-resistance state before the erase operation applied to the subarray 310 as a whole, remain in the anti-parallel polarization, high-resistance state after the erase operation. The control circuit 68 is configured to erase an entire subarray of bitcells by providing the magnetic assistance and the appropriate parallel to antiparallel state change write currents through each bitcell of the subarray 310 as described above. Once all the bitcells 64 of the subarray 310 have been erased, such that they each store a logical zero, write data may be written into a portion of the subarray (such as a word, line or page, for example). Because the logical zeroes have already been written into the subarray by erasing the subarray, the writing of data into the subarray may be limited to just writing the bit values of the write data which are logical ones.

In the illustrated embodiment, the parallel polarization, low-resistance state, is selected to represent a logical one stored in the bitcell. Hence, to write a logical one into a bitcell which is initially in the anti-parallel polarization, high-resistance state representing a logical zero, an appropriate antiparallel to parallel state change write current is driven through the particular bitcell to switch the polarization state of the bitcell from anti-parallel to parallel. As previously mentioned, switching the polarization state of an STT bitcell from anti-parallel to parallel typically requires substantially less write time and power as compared to switching the polarization state of an STT bitcell from parallel to anti-parallel polarization. Accordingly, in one embodiment, an assistive magnetic field may be omitted when writing logical ones to switch the polarization state of the bitcell from anti-parallel to parallel. It is appreciated that in other embodiments, appropriate assistive magnetic fields may be directed through bitcells for both state changes, that is, from parallel to anti-parallel polarization, and vice versa. It is further appreciated that in other embodiments, the anti-parallel polarization, high-resistance state, may be selected to represent a logical one stored in the bitcell, and the parallel polarization, low-resistance state, may be selected to represent a logical zero stored in the bitcell.

FIG. 6A shows an example of a line of write data which is eight bits in length and contains a sequence of logical ones and zeros, "10011010" in this example. The control circuit 68 (FIG. 1B) is configured to write only the logical ones to an erased line of bitcells 64a, 64b . . . 64h (FIG. 6B). Accordingly, the control circuit 68 is also configured to treat the logical zeros of the line of write data as "hold" values as represented by the letter "H", so that the polarization states and hence the bit values of the corresponding bitcells of the erased line of bitcells 64a, 64b . . . 64h (FIG. 6B) are maintained, that is, remain unchanged. Thus, the write data sequence "10011010" is effectively converted by the control circuit 68 to a write sequence "1HH11H1H" as shown in FIG. 6A, of which the logical ones only are to be written to the erased line of bitcells 64a, 64b . . . 64h as shown in FIG. 6B.

The control circuit 68 is configured to write each logical one value of the write sequence "1HH11H1H" into the corresponding bitcell as shown by the bitcells 64a, 64d, 64e and 64g of FIG. 6C. In this example, a logical one is written by changing the state of the corresponding bit cell from the high resistance, antiparallel polarization state to the low resistance, parallel polarization state. Conversely, each of the hold values represented by the letter H of the write sequence "1HH11H1H" causes the control circuit 68 to hold or maintain the state and hence hold or maintain the previously stored bit value of logical zero in each of the corresponding bitcells 64b, 64c, 64f and 64h which were previously erased by the prior magnetic field-assisted erase function. In this example, a logical zero is represented by the high resistance, anti-parallel state in this example.

Figure 7:
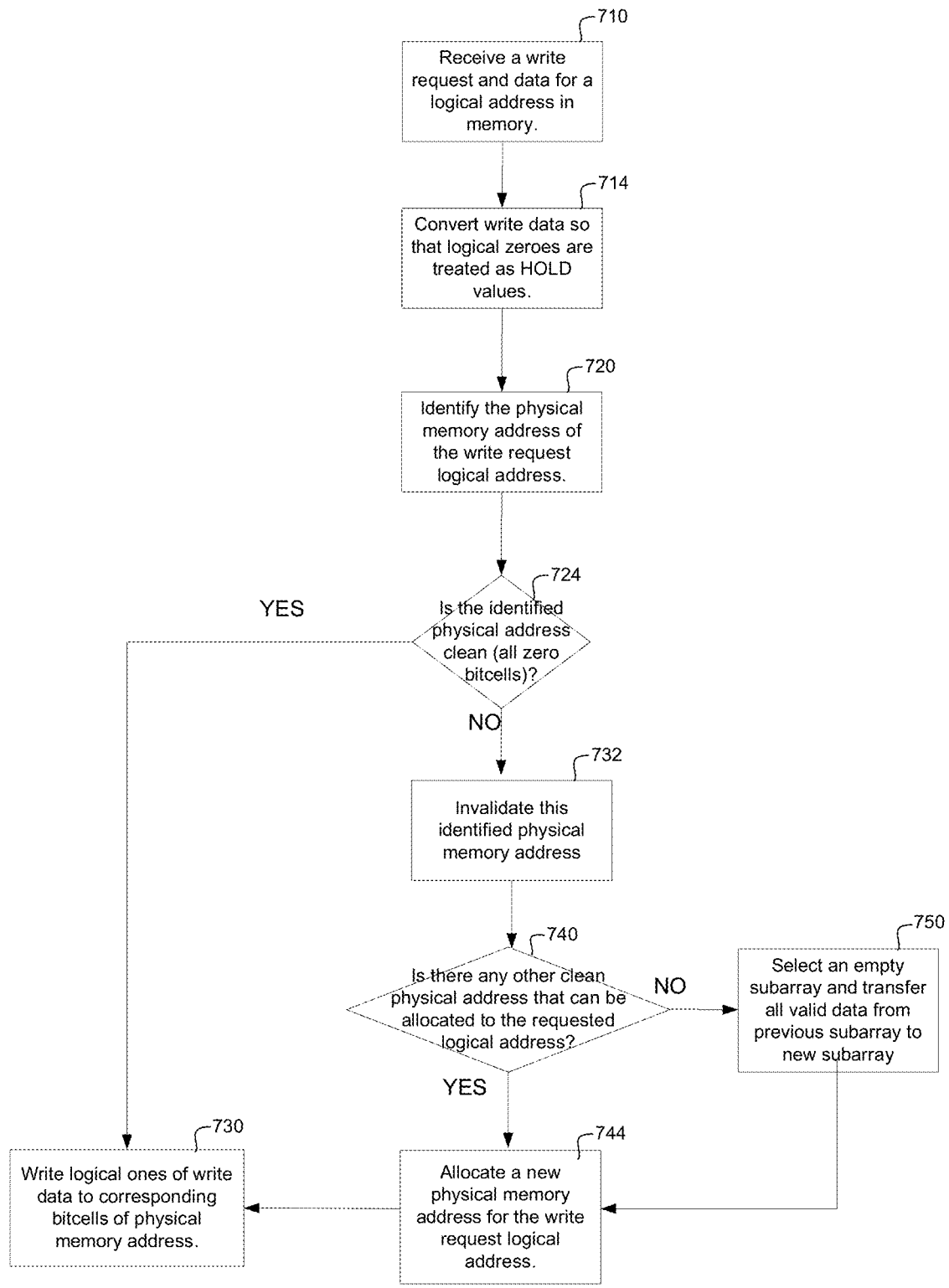
FIG. 7 depicts one example of operations for writing write data to bitcells of the STTRAM memory of FIG. 1B in accordance with an embodiment of the present disclosure.

FIG. 7 depicts an example of operations of a magnetic field-assisted MRAM such as an STTRAM in accordance with one embodiment of the present description. In this example, the control circuit 68 is configured to perform the described operations.

In a first operation, write data to be written to a logical address corresponding to a first physical address of bitcells in a memory such as the subarray 310, for example, is received (block 710). The write data is converted (block 714) so that the logical zeroes of the write data are treated as "hold" values as described in connection with FIG. 6A, for example. In this manner, the write data is changed so that all the zeroes are replaced with a hold state. In this example, logical zeroes are represented by the high resistance, anti-parallel polarization state of the bitcell of an STTRAM. It is appreciated that in other embodiments, logical ones may be represented by the high resistance, anti-parallel polarization state of the bitcell of an STTRAM. In such embodiments, the write data would converted (block 714) so that the logical ones instead of the logical zeroes of the write data are treated as "hold" values.

In this example, a physical line of the STTRAM is allocated to a logical line. The physical address associated with the logical address destination of the write data is identified (block 720) and a determination is made as to whether (block 724) the bitcells of that physical address are "clean", that is, erased to all logical zeros. If so, the logical ones of the write data may be written (block 730) to the corresponding bitcells of that physical address without modifying the remaining bits that hold a zero bit value, in a manner similar to that depicted in FIG. 6C. Accordingly, the logical zeroes of the write data treated as hold values cause the corresponding bitcells of that physical address to remain in the logical zero state in a manner similar to that depicted in FIG. 6C.

Conversely, if it is determined (block 724) that the bitcells of that physical address are not "clean", that is, contain one or more logical one values, the first physical address is invalidated (block 732).

Figure 8A:
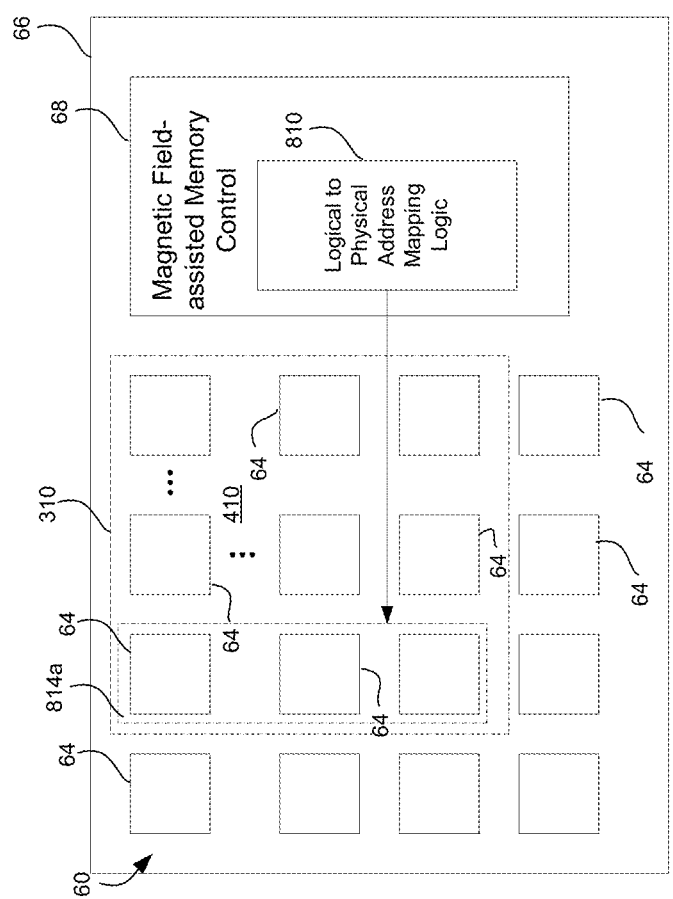
FIGS. 8A and 8B depict logical to physical address mapping logic of the control circuit of the STTRAM memory of FIG. 1B, in accordance with an embodiment of the present disclosure, remapping a logical address for a line of memory from one memory line physical address to another memory line physical address.
Figure 8B:
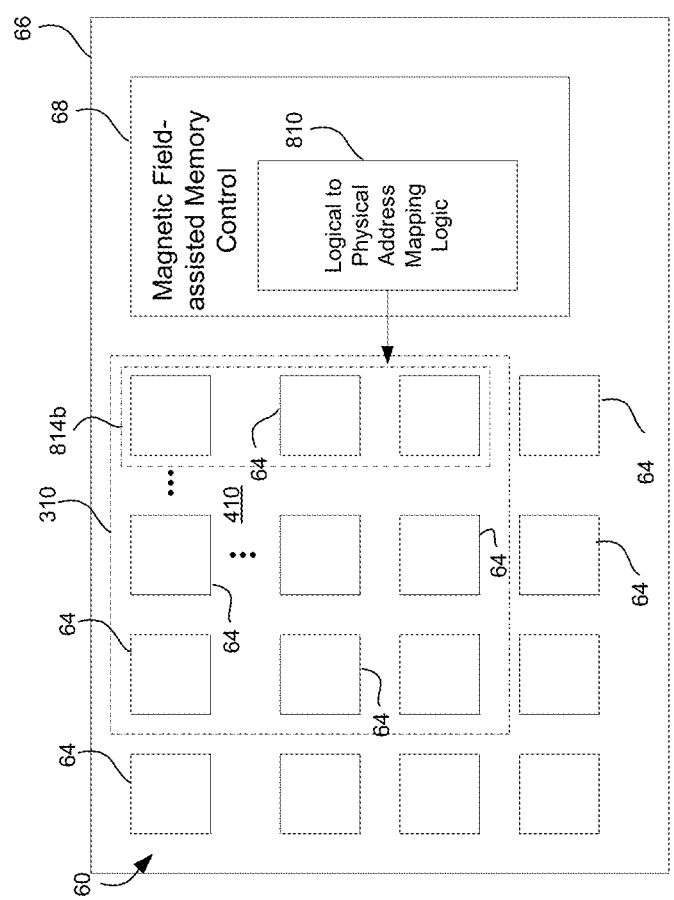

A determination is made as to whether (block 740) a clean physical address (that is, a physical address in which all bitcells have been erased to all logical zeros) is available in the subarray. If so, the second, clean physical address is allocated (block 744) to the logical address destination of the write data. FIGS. 8A and 8B depict an example of a logical to physical address mapping logic 810 of the magnetic field-assisted memory control circuit 68 for the array 60 of bitcells 64, remapping a logical address for a memory line from a first physical address for a memory line 814a (FIG. 8A) of the subarray 310, to a second physical address for a different memory line 814b of the subarray 310 (FIG. 8B).

In addition, the logical ones of the write data may be written (block 730) to the corresponding bitcells of the second physical address in a manner similar to that depicted in FIG. 6C. Accordingly, the logical zeroes of the write data treated as hold values cause the corresponding bitcells of the second physical address to remain in the logical zero state in a manner similar to that depicted in FIG. 6C.

Conversely, if it is determined (block 740) that a clean physical address (that is, a physical address in which all bitcells have been erased to all logical zeros) is not available in the subarray, a second subarray of bitcells that is available and empty (i.e., clean) is selected (block 750) and all valid data in the original, first subarray is transferred to the second, selected subarray. The data is transferred by writing the logical ones of the valid transfer data to the destination physical addresses of the second array in a manner similar to that described in connection with block 730. After the valid transfer data has been transferred to the second subarray, the first subarray may be erased with magnetic field assistance as described herein.

In addition, a third, clean physical address of the second subarray is allocated (block 744) to the logical address destination of the received write data (block 710) and the logical ones of the received write data may be written (block 730) to the corresponding bitcells of the third physical address of the second subarray in a manner similar to that depicted in FIG. 6C. Accordingly, the logical zeroes of the received write data treated as hold values, cause the corresponding bitcells of the third physical address of the second subarray to remain in the logical zero state in a manner similar to that depicted in FIG. 6C.

EXAMPLES

The following examples pertain to further embodiments.

Example 1 is an apparatus comprising: an array of magnetoresistive (MRAM) bitcells having a first subarray of MRAM bitcells wherein each bitcell includes a ferromagnetic device having a polarization which in a first state is one of parallel and anti-parallel polarization and in a second state is the other of parallel and anti-parallel polarization; control circuitry configured to change the state of bitcells of the first subarray in the first state to the second state, so that ferromagnetic devices of bitcells of the first subarray have the polarization exhibited by a bitcell in the second state; and an electro-magnet positioned adjacent the first subarray to direct a magnetic field through the ferromagnetic device of the bitcells of the first subarray to assist in the changing of states of bitcells of the first subarray of the array of bitcells of the MRAM from the first state to the second state.

In Example 2, the subject matter of Examples 1-10 (excluding the present Example) can optionally include wherein said MRAM bitcells are spin transfer torque (STT) random access memory (RAM) bitcells, said control circuitry is configured to direct spin-polarized current through the ferromagnetic device of bitcells of the first subarray to change the state of bitcells of the first subarray in the first state to the second state, so that ferromagnetic devices of bitcells of the first subarray have the polarization exhibited by a bitcell in the second state; said control circuitry is further configured to direct spin-polarized current through the ferromagnetic device of first selected bitcells of the first subarray to write data into those first selected bitcells of the first subarray by changing the first selected bitcells of the first subarray from the second state back to the first state so that each first selected bitcell changed back to the first state represents one of a logical one and a logical zero of the data, and wherein said control circuitry is further configured to maintain the state of second selected bitcells of the first subarray in the second state so that each second selected bitcell maintained in the second state represents the other of a logical one and a logical zero of the data.

In Example 3, the subject matter of Examples 1-10 (excluding the present Example) can optionally include wherein said control circuitry is further configured to erase data of bitcells of the first subarray, said erasing including said magnetic field-assisted changing of states of bitcells of the first subarray from the first state to the second state so that all bitcells of the first subarray exhibit the second state representing the other of a logical one and a logical zero.

In Example 4, the subject matter of Examples 1-10 (excluding the present Example) can optionally include wherein said electro-magnet includes a coil disposed adjacent to the first subarray.

In Example 5, the subject matter of Examples 1-10 (excluding the present Example) can optionally include wherein the first subarray of bitcells is arranged in a plane, wherein each ferromagnetic device of each bitcell of the first subarray has a ferromagnetic layer having a magnetization direction which is within the plane of the first subarray of bitcells, wherein said coil includes a plurality of turns, each of which is oriented substantially orthogonal to the plane of the first subarray of bitcells and wherein said electro-magnet is positioned to direct the magnetic field in a direction substantially parallel to the plane and to the magnetization direction of the ferromagnetic layer of the ferromagnetic devices of the bitcells of the first subarray.

In Example 6, the subject matter of Examples 1-10 (excluding the present Example) can optionally include wherein the first subarray of bitcells is arranged in a plane, wherein each ferromagnetic device of each bitcell of the first subarray has a ferromagnetic layer having a magnetization direction which is substantially orthogonal to the plane of the first subarray of bitcells wherein said coil includes a plurality of turns, each of which is oriented substantially parallel to the plane of the first subarray of bitcells and wherein said electro-magnet is positioned to direct the magnetic field in a direction substantially orthogonal to the plane, and substantially parallel to the magnetization direction of the ferromagnetic layer of the ferromagnetic devices of the bitcells of the first subarray.

In Example 7, the subject matter of Examples 1-10 (excluding the present Example) can optionally include wherein said control circuitry is further configured to: receive write data for a logical address associated with a first physical memory address within the first subarray of bitcells; determine if the bitcells of the first physical memory address are all changed to the second state so that all bitcells of the first physical memory address exhibit the second state representing the other of a logical one and a logical zero; and if it is determined that the bitcells of the first physical memory address are all changed to the second state, direct spin-polarized current through the ferromagnetic device of first selected bitcells of the first subarray to write data into first selected bitcells of the first physical memory address by changing first selected bitcells of the physical memory address from the second state back to the first state so that each first selected bitcell changed back to the first state represents the one of a logical one and a logical zero of the write data, and maintain the state of second selected bitcells of the first physical memory address in the second state so that each second selected bitcell maintained in the second state represents the other of a logical one and a logical zero of the write data.

In Example 8, the subject matter of Examples 1-10 (excluding the present Example) can optionally include wherein said control circuitry is further configured to: if it is determined that at least some of the bitcells of the first physical memory address are changed to the first state, determine if the bitcells of an available second physical memory address of the first subarray of bitcells are all changed to the second state so that all bitcells of the second physical memory address exhibit the second state representing the other of a logical one and a logical zero; and if it is determined that the bitcells of the available second physical memory address are all changed to the second state, invalidate the bitcells of the first physical memory address, allocate the second physical memory address to the logical memory address of the write data, and direct spin-polarized current through the ferromagnetic device of first selected bitcells of the second physical memory address to write data into first selected bitcells of the second physical memory address by changing first selected bitcells of the second physical memory address from the second state back to the first state so that each first selected bitcell changed back to the first state represents the one of a logical one and a logical zero of the write data, and maintain the state of second selected bitcells of the second physical memory address in the second state so that each second selected bitcell maintained in the second state represents the other of a logical one and a logical zero of the write data.

In Example 9, the subject matter of Examples 1-10 (excluding the present Example) can optionally include wherein said control circuitry is further configured to: if it is determined that there is no available second physical memory address of the first subarray of bitcells in which all bitcells of an available physical memory address are changed to the second state, select an available second subarray of bitcells in which all bitcells of the second subarray of bitcells exhibit the second state representing the other of a logical one and a logical zero; and allocate a third physical memory address of the second subarray to the logical memory address of the write data, and write data into bitcells of the third physical memory address by changing first selected bitcells of the third physical memory address from the second state back to the first state so that each first selected bitcell changed back to the first state represents the one of a logical one and a logical zero of the write data, and by maintaining the state of second selected bitcells of the third physical memory address in the second state so that each second selected bitcell maintained in the second state represents the other of a logical one and a logical zero of the write data.

In Example 10, the subject matter of Examples 1-10 (excluding the present Example) can optionally include wherein said control circuitry is further configured to: transfer all valid data stored in the first subarray to the second subarray of bitcells and erase data of bitcells of the first subarray, said erasing including said magnetic field-assisted changing of states of bitcells of the first subarray from the first state to the second state so that all bitcells of the first subarray exhibit the second state representing the other of a logical one and a logical zero.

Example 11 is directed to a computing system for use with a display, comprising: a memory; a processor configured to write data in and read data from the memory; and a video controller configured to display information represented by data in the memory; wherein the memory includes a magnetoresistive random access memory (MRAM), comprising: an array of MRAM bitcells having a first subarray of MRAM bitcells wherein each bitcell includes a ferromagnetic device having a polarization which in a first state is one of parallel and anti-parallel polarization and in a second state is the other of parallel and anti-parallel polarization; control circuitry configured to direct spin-polarized current through the ferromagnetic device of bitcells of the first subarray to change the state of bitcells of the first subarray in the first state to the second state, so that ferromagnetic devices of bitcells of the first subarray have the polarization exhibited by a bitcell in the second state; and an electro-magnet positioned adjacent the first subarray to direct a magnetic field through the ferromagnetic device of the bitcells of the first subarray to assist in the changing of states of bitcells of the first subarray of the array of bitcells of the STT MRAM from the first state to the second state.

In Example 12, the subject matter of Examples 11-20 (excluding the present Example) can optionally include wherein said MRAM bitcells are spin transfer torque (STT) random access memory (RAM) bitcells, said control circuitry is configured to direct spin-polarized current through the ferromagnetic device of bitcells of the first subarray to change the state of bitcells of the first subarray in the first state to the second state, so that ferromagnetic devices of bitcells of the first subarray have the polarization exhibited by a bitcell in the second state; said control circuitry is further configured to direct spin-polarized current through the ferromagnetic device of first selected bitcells of the first subarray to write data into those first selected bitcells of the first subarray by changing the first selected bitcells of the first subarray from the second state back to the first state so that each first selected bitcell changed back to the first state represents one of a logical one and a logical zero of the data, and wherein said control circuitry is further configured to maintain the state of second selected bitcells of the first subarray in the second state so that each second selected bitcell maintained in the second state represents the other of a logical one and a logical zero of the data.

In Example 13, the subject matter of Examples 11-20 (excluding the present Example) can optionally include wherein said control circuitry is further configured to erase data of bitcells of the first subarray, said erasing including said magnetic field-assisted changing of states of bitcells of the first subarray from the first state to the second state so that all bitcells of the first subarray exhibit the second state representing the other of a logical one and a logical zero.

In Example 14, the subject matter of Examples 11-20 (excluding the present Example) can optionally include wherein said electro-magnet includes a coil disposed adjacent to the first subarray.

In Example 15, the subject matter of Examples 11-20 (excluding the present Example) can optionally include wherein the first subarray of bitcells is arranged in a plane, wherein each ferromagnetic device of each bitcell of the first subarray has a ferromagnetic layer having a magnetization direction which is within the plane of the first subarray of bitcells, wherein said coil includes a plurality of turns, each of which is oriented substantially orthogonal to the plane of the first subarray of bitcells and wherein said electro-magnet is positioned to direct the magnetic field in a direction substantially parallel to the plane and to the magnetization direction of the ferromagnetic layer of the ferromagnetic devices of the bitcells of the first subarray.

In Example 16, the subject matter of Examples 11-20 (excluding the present Example) can optionally include wherein the first subarray of bitcells is arranged in a plane, wherein each ferromagnetic device of each bitcell of the first subarray has a ferromagnetic layer having a magnetization direction which is substantially orthogonal to the plane of the first subarray of bitcells wherein said coil includes a plurality of turns, each of which is oriented substantially parallel to the plane of the first subarray of bitcells and wherein said electro-magnet is positioned to direct the magnetic field in a direction substantially orthogonal to the plane, and substantially parallel to the magnetization direction of the ferromagnetic layer of the ferromagnetic devices of the bitcells of the first subarray.

In Example 17, the subject matter of Examples 11-20 (excluding the present Example) can optionally include wherein said control circuitry is further configured to: receive write data for a logical address associated with a first physical memory address within the first subarray of bitcells; determine if the bitcells of the first physical memory address are all changed to the second state so that all bitcells of the first physical memory address exhibit the second state representing the other of a logical one and a logical zero; and if it is determined that the bitcells of the first physical memory address are all changed to the second state, direct spin-polarized current through the ferromagnetic device of first selected bitcells of the first subarray to write data into first selected bitcells of the first physical memory address by changing first selected bitcells of the physical memory address from the second state back to the first state so that each first selected bitcell changed back to the first state represents the one of a logical one and a logical zero of the write data, and maintain the state of second selected bitcells of the first physical memory address in the second state so that each second selected bitcell maintained in the second state represents the other of a logical one and a logical zero of the write data.

In Example 18, the subject matter of Examples 11-20 (excluding the present Example) can optionally include wherein said control circuitry is further configured to: if it is determined that at least some of the bitcells of the first physical memory address are changed to the first state, determine if the bitcells of an available second physical memory address of the first subarray of bitcells are all changed to the second state so that all bitcells of the second physical memory address exhibit the second state representing the other of a logical one and a logical zero; and if it is determined that the bitcells of the available second physical memory address are all changed to the second state, invalidate the bitcells of the first physical memory address, allocate the second physical memory address to the logical memory address of the write data, and direct spin-polarized current through the ferromagnetic device of first selected bitcells of the second physical memory address to write data into first selected bitcells of the second physical memory address by changing first selected bitcells of the second physical memory address from the second state back to the first state so that each first selected bitcell changed back to the first state represents the one of a logical one and a logical zero of the write data, and maintain the state of second selected bitcells of the second physical memory address in the second state so that each second selected bitcell maintained in the second state represents the other of a logical one and a logical zero of the write data.

In Example 19, the subject matter of Examples 11-20 (excluding the present Example) can optionally include wherein said control circuitry is further configured to: if it is determined that there is no available second physical memory address of the first subarray of bitcells in which all bitcells of an available physical memory address are changed to the second state, select an available second subarray of bitcells in which all bitcells of the second subarray of bitcells exhibit the second state representing the other of a logical one and a logical zero; and allocate a third physical memory address of the second subarray to the logical memory address of the write data, and write data into bitcells of the third physical memory address by changing first selected bitcells of the third physical memory address from the second state back to the first state so that each first selected bitcell changed back to the first state represents the one of a logical one and a logical zero of the write data, and by maintaining the state of second selected bitcells of the third physical memory address in the second state so that each second selected bitcell maintained in the second state represents the other of a logical one and a logical zero of the write data.

In Example 20, the subject matter of Examples 11-20 (excluding the present Example) can optionally include wherein said control circuitry is further configured to: transfer all valid data stored in the first subarray to the second subarray of bitcells and erase data of bitcells of the first subarray, said erasing including said magnetic field-assisted changing of states of bitcells of the first subarray from the first state to the second state so that all bitcells of the first subarray exhibit the second state representing the other of a logical one and a logical zero.

Example 21 is directed to a method of operating a magnetoresistive random access memory (MRAM), comprising: magnetic field-assisted changing of states of bitcells of a first subarray of an array of bitcells of the MRAM from a first state to a second state so that the changed state bitcells of the first subarray exhibit the second state wherein the first state represents one of a logical one and a logical zero and the second state represents the other of a logical one and a logical zero, wherein each bitcell includes a ferromagnetic device having a polarization which in the first state is one of parallel and anti-parallel polarization and in the second state is the other of parallel and anti-parallel polarization, and wherein the magnetic field-assisted changing includes directing a magnetic field through the ferromagnetic device of bitcells of the first subarray to assist in the changing of states of bitcells of the first subarray of the array of bitcells of the MRAM from the first state to the second state.

In Example 22, the subject matter of Examples 21-30 (excluding the present Example) can optionally include wherein the MRAM is a spin transfer torque (STT) MRAM and the magnetic field-assisted changing further includes directing spin-polarized current through the ferromagnetic device of bitcells of the first subarray to change the state of bitcells of the first subarray in the first state to the second state, so that ferromagnetic devices of bitcells of the first subarray have the polarization exhibited by a bitcell in the second state, the method further comprising:

writing data into bitcells of the first subarray by changing first selected bitcells of the first subarray from the second state back to the first state so that each first selected bitcell changed back to the first state represents the one of a logical one and a logical zero of the data, and by maintaining the state of second selected bitcells of the first subarray in the second state so that each second selected bitcell maintained in the second state represents the other of a logical one and a logical zero of the data.

In Example 23, the subject matter of Examples 21-30 (excluding the present Example) can optionally include erasing data of bitcells of the first subarray, said erasing including said magnetic field-assisted changing of states of bitcells of the first subarray from the first state to the second state so that all bitcells of the first subarray exhibit the second state representing the other of a logical one and a logical zero.

In Example 24, the subject matter of Examples 21-30 (excluding the present Example) can optionally include wherein said magnetic field directing includes generating the magnetic field using a coil disposed adjacent to the first subarray.

In Example 25, the subject matter of Examples 21-30 (excluding the present Example) can optionally include wherein the first subarray of bitcells is arranged in a plane, wherein each ferromagnetic device of each bitcell of the first subarray has a ferromagnetic layer having a magnetization direction which is within the plane of the first subarray of bitcells, wherein said coil includes a plurality of turns, each of which is oriented substantially orthogonal to the plane of the first subarray of bitcells and wherein said magnetic field directing includes directing the magnetic field in a direction substantially parallel to the plane and to the magnetization direction of the ferromagnetic layer of the ferromagnetic devices of the bitcells of the first subarray.

In Example 26, the subject matter of Examples 21-30 (excluding the present Example) can optionally include wherein the first subarray of bitcells is arranged in a plane, wherein each ferromagnetic device of each bitcell of the first subarray has a ferromagnetic layer having a magnetization direction which is substantially orthogonal to the plane of the first subarray of bitcells wherein said coil includes a plurality of turns, each of which is oriented substantially parallel to the plane of the first subarray of bitcells and wherein said magnetic field directing includes directing the magnetic field in a direction substantially orthogonal to the plane, and substantially parallel to the magnetization direction of the ferromagnetic layer of the ferromagnetic devices of the bitcells of the first subarray.

In Example 27, the subject matter of Examples 21-30 (excluding the present Example) can optionally include receiving write data for a logical address associated with a first physical memory address within the first subarray of bitcells; determining if the bitcells of the first physical memory address are all changed to the second state so that all bitcells of the first physical memory address exhibit the second state representing the other of a logical one and a logical zero; and if it is determined that the bitcells of the first physical memory address are all changed to the second state, writing write data into bitcells of the first physical memory address by changing first selected bitcells of the physical memory address from the second state back to the first state so that each first selected bitcell changed back to the first state represents the one of a logical one and a logical zero of the write data, said changing including directing spin-polarized current through the ferromagnetic device of first selected bitcells f the first physical memory address, and by maintaining the state of second selected bitcells of the first physical memory address in the second state so that each second selected bitcell maintained in the second state represents the other of a logical one and a logical zero of the write data.

In Example 28, the subject matter of Examples 21-30 (excluding the present Example) can optionally include if it is determined that at least some of the bitcells of the first physical memory address are changed to the first state, determining if the bitcells of an available second physical memory address of the first subarray of bitcells are all changed to the second state so that all bitcells of the second physical memory address exhibit the second state representing the other of a logical one and a logical zero; and if it is determined that the bitcells of the available second physical memory address are all changed to the second state, invalidating the bitcells of the first physical memory address, allocating the second physical memory address to the logical memory address of the write data, and writing write data into bitcells of the second physical memory address by changing first selected bitcells of the second physical memory address from the second state back to the first state so that each first selected bitcell changed back to the first state represents the one of a logical one and a logical zero of the write data, said changing including directing spin-polarized current through the ferromagnetic device of first selected bitcells of the second physical memory address, and by maintaining the state of second selected bitcells of the second physical memory address in the second state so that each second selected bitcell maintained in the second state represents the other of a logical one and a logical zero of the write data.

In Example 29, the subject matter of Examples 21-30 (excluding the present Example) can optionally include if it is determined that there is no available second physical memory address of the first subarray of bitcells in which all bitcells of an available physical memory address are changed to the second state, selecting an available second subarray of bitcells in which all bitcells of the available second subarray of bitcells exhibit the second state representing the other of a logical one and a logical zero; and allocating a third physical memory address of the second subarray to the logical memory address of the write data, and writing write data into bitcells of the third physical memory address by changing first selected bitcells of the third physical memory address from the second state back to the first state so that each first selected bitcell changed back to the first state represents the one of a logical one and a logical zero of the write data, and by maintaining the state of second selected bitcells of the third physical memory address in the second state so that each second selected bitcell maintained in the second state represents the other of a logical one and a logical zero of the write data.

In Example 30, the subject matter of Examples 21-30 (excluding the present Example) can optionally include transferring all valid data stored in the first subarray to the second subarray of subcells and erasing data of bitcells of the first subarray, said erasing including said magnetic field-assisted changing of states of bitcells of the first subarray from the first state to the second state so that all bitcells of the first subarray exhibit the second state representing the other of a logical one and a logical zero.

Example 31 is directed to an apparatus comprising means to perform a method as described in any preceding Example.

The described operations may be implemented as a method, apparatus or computer program product using standard programming and/or engineering techniques to produce software, firmware, hardware, or any combination thereof. The described operations may be implemented as computer program code maintained in a "computer readable storage medium", where a processor may read and execute the code from the computer storage readable medium. The computer readable storage medium includes at least one of electronic circuitry, storage materials, inorganic materials, organic materials, biological materials, a casing, a housing, a coating, and hardware. A computer readable storage medium may comprise, but is not limited to, a magnetic storage medium (e.g., hard disk drives, floppy disks, tape, etc.), optical storage (CD-ROMs, DVDs, optical disks, etc.), volatile and non-volatile memory devices (e.g., EEPROMs, ROMs, PROMs, RAMs, DRAMs, SRAMs, Flash Memory, firmware, programmable logic, etc.), Solid State Devices (SSD), etc. The code implementing the described operations may further be implemented in hardware logic implemented in a hardware device (e.g., an integrated circuit chip, Programmable Gate Array (PGA), Application Specific Integrated Circuit (ASIC), etc.). Still further, the code implementing the described operations may be implemented in "transmission signals", where transmission signals may propagate through space or through a transmission media, such as an optical fiber, copper wire, etc. The transmission signals in which the code or logic is encoded may further comprise a wireless signal, satellite transmission, radio waves, infrared signals, Bluetooth, etc. The program code embedded on a computer readable storage medium may be transmitted as transmission signals from a transmitting station or computer to a receiving station or computer. A computer readable storage medium is not comprised solely of transmissions signals. Those skilled in the art will recognize that many modifications may be made to this configuration without departing from the scope of the present description, and that the article of manufacture may comprise suitable information bearing medium known in the art. Of course, those skilled in the art will recognize that many modifications may be made to this configuration without departing from the scope of the present description, and that the article of manufacture may comprise any tangible information bearing medium known in the art.

In certain applications, a device in accordance with the present description, may be embodied in a computer system including a video controller to render information to display on a monitor or other display coupled to the computer system, a device driver and a network controller, such as a computer system comprising a desktop, workstation, server, mainframe, laptop, handheld computer, etc. Alternatively, the device embodiments may be embodied in a computing device that does not include, for example, a video controller, such as a switch, router, etc., or does not include a network controller, for example.

The illustrated logic of figures may show certain events occurring in a certain order. In alternative embodiments, certain operations may be performed in a different order, modified or removed. Moreover, operations may be added to the above described logic and still conform to the described embodiments. Further, operations described herein may occur sequentially or certain operations may be processed in parallel. Yet further, operations may be performed by a single processing unit or by distributed processing units.

The foregoing description of various embodiments has been presented for the purposes of illustration and description. It is not intended to be exhaustive or to limit to the precise form disclosed. Many modifications and variations are possible in light of the above teaching.

What is claimed is:

1. An apparatus comprising:
   a memory configured to store data at physical memory addresses and to read data stored at physical memory addresses, the memory comprising:
      an array of magnetoresistive (MRAM) bitcells having a first subarray of MRAM bitcells wherein each bitcell has a physical memory address and includes a ferromagnetic device having a polarization which in a first state is one of parallel and anti-parallel polarization and in a second state is the other of parallel and anti-parallel polarization;
      control circuitry configured to direct current through the ferromagnetic devices of bitcells to change a state of bitcells of the first subarray in the first state to the second state, so that ferromagnetic devices of bitcells of the first subarray have the polarization exhibited by a bitcell in the second state; and
      an electro-magnet positioned adjacent the first subarray to direct a magnetic field through the ferromagnetic device of the bitcells of the first subarray to assist in the changing of states of bitcells of the first subarray of the array of bitcells of the MRAM from the first state to the second state;
   wherein said MRAM bitcells are spin transfer torque (STT) random access memory (RAM) bitcells, said control circuitry is configured to direct spin-polarized current through the ferromagnetic device of bitcells of the first subarray to change the state of bitcells of the first subarray in the first state to the second state, so that ferromagnetic devices of bitcells of the first subarray have the polarization exhibited by a bitcell in the second state; said control circuitry is further configured to direct spin-polarized current through the ferromagnetic device of first selected bitcells of the first subarray to write data into those first selected bitcells of the first subarray by changing the first selected bitcells of the first subarray from the second state back to the first state so that each first selected bitcell changed back to the first state represents one of a logical one and a logical zero of the data, and wherein said control circuitry is further configured to maintain a state of second selected bitcells of the first subarray in the second state so that each second selected bitcell maintained in the second state represents the other of a logical one and a logical zero of the data; and
   wherein said control circuitry is further configured to:
      receive write data for a logical address associated with a first physical memory address within the first subarray of bitcells;
      determine if the bitcells of the first physical memory address are all changed to the second state so that all bitcells of the first physical memory address exhibit the second state representing the other of a logical one and a logical zero; and
      if it is determined that the bitcells of the first physical memory address are all changed to the second state, direct spin-polarized current through the ferromagnetic device of first selected bitcells of the first subarray to write data into first selected bitcells of the first physical memory address by changing first selected bitcells of the physical memory address from the second state back to the first state so that each first selected bitcell changed back to the first state represents the one of a logical one and a logical zero of the write data, and maintain the state of second selected bitcells of the first physical memory address in the second state so that each second selected bitcell maintained in the second state represents the other of a logical one and a logical zero of the write data.

2. The apparatus of claim 1 wherein said control circuitry is further configured to erase data of bitcells of the first subarray, said erasing including said magnetic field-assisted changing of states of bitcells of the first subarray from the first state to the second state so that all bitcells of the first subarray exhibit the second state representing the other of a logical one and a logical zero.

3. The apparatus of claim 1 wherein said electro-magnet includes a coil disposed adjacent to the first subarray.

4. The apparatus of claim 3 wherein the first subarray of bitcells is arranged in a plane, wherein each ferromagnetic device of each bitcell of the first subarray has a ferromagnetic layer having a magnetization direction which is within the plane of the first subarray of bitcells, wherein said coil includes a plurality of turns, each of which is oriented substantially orthogonal to the plane of the first subarray of bitcells and wherein said electro-magnet is positioned to direct the magnetic field in a direction substantially parallel to the plane and to the magnetization direction of the ferromagnetic layer of the ferromagnetic devices of the bitcells of the first subarray.

5. The apparatus of claim 3 wherein the first subarray of bitcells is arranged in a plane, wherein each ferromagnetic device of each bitcell of the first subarray has a ferromagnetic layer having a magnetization direction which is substantially orthogonal to the plane of the first subarray of bitcells wherein said coil includes a plurality of turns, each of which is oriented substantially parallel to the plane of the first subarray of bitcells and wherein said electro-magnet is positioned to direct the magnetic field in a direction substantially orthogonal to the plane, and substantially parallel to the magnetization direction of the ferromagnetic layer of the ferromagnetic devices of the bitcells of the first subarray.

6. The apparatus of claim 1 wherein said control circuitry is further configured to:
   if it is determined that at least some of the bitcells of the first physical memory address are changed to the first state, determine if the bitcells of an available second physical memory address of the first subarray of bitcells are all changed to the second state so that all bitcells of the second physical memory address exhibit the second state representing the other of a logical one and a logical zero; and
   if it is determined that the bitcells of the available second physical memory address are all changed to the second state, invalidate the bitcells of the first physical memory address, allocate the second physical memory address to a logical memory address of the write data, and direct spin-polarized current through the ferromagnetic device of first selected bitcells of the second physical memory address to write data into first selected bitcells of the second physical memory address by changing first selected bitcells of the second physical memory address from the second state back to the first state so that each first selected bitcell changed back to the first state represents the one of a logical one and a logical zero of the write data, and maintain the state of second selected bitcells of the second physical memory address in the second state so that each second selected bitcell maintained in the second state represents the other of a logical one and a logical zero of the write data.

7. The apparatus of claim 6 wherein said control circuitry is further configured to:
if it is determined that there is no available second physical memory address of the first subarray of bitcells in which all bitcells of an available physical memory address are changed to the second state, select an available second subarray of bitcells in which all bitcells of the second subarray of bitcells exhibit the second state representing the other of a logical one and a logical zero; and
allocate a third physical memory address of the second subarray to the logical memory address of the write data, and write data into bitcells of the third physical memory address by changing first selected bitcells of the third physical memory address from the second state back to the first state so that each first selected bitcell changed back to the first state represents the one of a logical one and a logical zero of the write data, and by maintaining the state of second selected bitcells of the third physical memory address in the second state so that each second selected bitcell maintained in the second state represents the other of a logical one and a logical zero of the write data.

8. The apparatus of claim 7 wherein said control circuitry is further configured to:
transfer all valid data stored in the first subarray to the second subarray of bitcells and erase data of bitcells of the first subarray, said erasing including said magnetic field-assisted changing of states of bitcells of the first subarray from the first state to the second state so that all bitcells of the first subarray exhibit the second state representing the other of a logical one and a logical zero.

9. A computing system for use with a display, comprising:
a memory;
a processor configured to write data in and read data from the memory; and
a video controller configured to display information represented by data in the memory;
wherein the memory is configured to store data at physical memory addresses and to read data stored at physical memory addresses and includes a magnetoresistive random access memory (MRAM), comprising:
an array of MRAM bitcells having a first subarray of MRAM bitcells wherein each bitcell has a physical memory address and includes a ferromagnetic device having a polarization which in a first state is one of parallel and anti-parallel polarization and in a second state is the other of parallel and anti-parallel polarization;
control circuitry configured to direct spin-polarized current through the ferromagnetic device of bitcells of the first subarray to change a state of bitcells of the first subarray in the first state to the second state, so that ferromagnetic devices of bitcells of the first subarray have the polarization exhibited by a bitcell in the second state; and
an electro-magnet positioned adjacent the first subarray to direct a magnetic field through the ferromagnetic device of the bitcells of the first subarray to assist in the changing of states of bitcells of the first subarray of the array of bitcells of the MRAM from the first state to the second state;
wherein said MRAM bitcells are spin transfer torque (STT) random access memory (RAM) bitcells, said control circuitry is configured to direct spin-polarized current through the ferromagnetic device of bitcells of the first subarray to change the state of bitcells of the first subarray in the first state to the second state, so that ferromagnetic devices of bitcells of the first subarray have the polarization exhibited by a bitcell in the second state; said control circuitry is further configured to direct spin-polarized current through the ferromagnetic device of first selected bitcells of the first subarray to write data into those first selected bitcells of the first subarray by changing the first selected bitcells of the first subarray from the second state back to the first state so that each first selected bitcell changed back to the first state represents one of a logical one and a logical zero of the data, and wherein said control circuitry is further configured to maintain a state of second selected bitcells of the first subarray in the second state so that each second selected bitcell maintained in the second state represents the other of a logical one and a logical zero of the data; and
wherein said control circuitry is further configured to:
receive write data for a logical address associated with a first physical memory address within the first subarray of bitcells;
determine if the bitcells of the first physical memory address are all changed to the second state so that all bitcells of the first physical memory address exhibit the second state representing the other of a logical one and a logical zero; and
if it is determined that the bitcells of the first physical memory address are all changed to the second state, direct spin-polarized current through the ferromagnetic device of first selected bitcells of the first subarray to write data into first selected bitcells of the first physical memory address by changing first selected bitcells of the physical memory address from the second state back to the first state so that each first selected bitcell changed back to the first state represents the one of a logical one and a logical zero of the write data, and maintain the state of second selected bitcells of the first physical memory address in the second state so that each second selected bitcell maintained in the second state represents the other of a logical one and a logical zero of the write data.

10. The system of claim 9 wherein said control circuitry is further configured to erase data of bitcells of the first subarray, said erasing including said magnetic field-assisted changing of states of bitcells of the first subarray from the first state to the second state so that all bitcells of the first subarray exhibit the second state representing the other of a logical one and a logical zero.

11. The system of claim 9 wherein said electro-magnet includes a coil disposed adjacent to the first subarray.

12. The system of claim 11 wherein the first subarray of bitcells is arranged in a plane, wherein each ferromagnetic device of each bitcell of the first subarray has a ferromagnetic layer having a magnetization direction which is within the plane of the first subarray of bitcells, wherein said coil includes a plurality of turns, each of which is oriented substantially orthogonal to the plane of the first subarray of bitcells and wherein said electro-magnet is positioned to direct the magnetic field in a direction substantially parallel to the plane and to the magnetization direction of the ferromagnetic layer of the ferromagnetic devices of the bitcells of the first subarray.

13. The system of claim 11 wherein the first subarray of bitcells is arranged in a plane, wherein each ferromagnetic device of each bitcell of the first subarray has a ferromagnetic layer having a magnetization direction which is substantially orthogonal to the plane of the first subarray of bitcells wherein said coil includes a plurality of turns, each of which is oriented substantially parallel to the plane of the first subarray of bitcells and wherein said electro-magnet is positioned to direct the magnetic field in a direction substantially orthogonal to the plane, and substantially parallel to the magnetization direction of the ferromagnetic layer of the ferromagnetic devices of the bitcells of the first subarray.

14. The system of claim 9 wherein said control circuitry is further configured to:
if it is determined that at least some of the bitcells of the first physical memory address are changed to the first state, determine if the bitcells of an available second physical memory address of the first subarray of bitcells are all changed to the second state so that all bitcells of the second physical memory address exhibit the second state representing the other of a logical one and a logical zero; and
if it is determined that the bitcells of the available second physical memory address are all changed to the second state, invalidate the bitcells of the first physical memory address, allocate the second physical memory address to a logical memory address of the write data, and direct spin-polarized current through the ferromagnetic device of first selected bitcells of the second physical memory address to write data into first selected bitcells of the second physical memory address by changing first selected bitcells of the second physical memory address from the second state back to the first state so that each first selected bitcell changed back to the first state represents the one of a logical one and a logical zero of the write data, and maintain the state of second selected bitcells of the second physical memory address in the second state so that each second selected bitcell maintained in the second state represents the other of a logical one and a logical zero of the write data.

15. The system of claim 14 wherein said control circuitry is further configured to:
if it is determined that there is no available second physical memory address of the first subarray of bitcells in which all bitcells of an available physical memory address are changed to the second state, select an available second subarray of bitcells in which all bitcells of the second subarray of bitcells exhibit the second state representing the other of a logical one and a logical zero; and
allocate a third physical memory address of the second subarray to the logical memory address of the write data, and write data into bitcells of the third physical memory address by changing first selected bitcells of the third physical memory address from the second state back to the first state so that each first selected bitcell changed back to the first state represents the one of a logical one and a logical zero of the write data, and by maintaining the state of second selected bitcells of the third physical memory address in the second state so that each second selected bitcell maintained in the second state represents the other of a logical one and a logical zero of the write data.

16. The system of claim 15 wherein said control circuitry is further configured to:
transfer all valid data stored in the first subarray to the second subarray of bitcells and erase data of bitcells of the first subarray, said erasing including said magnetic field-assisted changing of states of bitcells of the first subarray from the first state to the second state so that all bitcells of the first subarray exhibit the second state representing the other of a logical one and a logical zero.

17. A method of operating a magnetoresistive random access memory (MRAM) configured to store data at physical memory addresses and to read data stored at physical memory addresses, comprising:
magnetic field-assisted changing of states of bitcells of a first subarray of an array of bitcells of the MRAM from a first state to a second state so that the changed state bitcells of the first subarray exhibit the second state wherein the first state represents one of a logical one and a logical zero and the second state represents the other of a logical one and a logical zero, wherein each bitcell has a physical memory address and includes a ferromagnetic device having a polarization which in the first state is one of parallel and anti-parallel polarization and in the second state is the other of parallel and anti-parallel polarization, and wherein the magnetic field-assisted changing includes directing current through the ferromagnetic devices of bitcells and directing a magnetic field through the ferromagnetic device of bitcells of the first subarray to assist in the changing of states of bitcells of the first subarray of the array of bitcells of the MRAM from the first state to the second state;
wherein the MRAM is a spin transfer torque (STT) MRAM and the magnetic field-assisted changing further includes directing spin-polarized current through the ferromagnetic device of bitcells of the first subarray to change a state of bitcells of the first subarray in the first state to the second state, so that ferromagnetic devices of bitcells of the first subarray have the polarization exhibited by a bitcell in the second state, the method further comprising:
writing data into bitcells of the first subarray by changing first selected bitcells of the first subarray from the second state back to the first state so that each first selected bitcell changed back to the first state represents the one of a logical one and a logical zero of the data, and by maintaining a state of second selected bitcells of the first subarray in the second state so that each second selected bitcell maintained in the second state represents the other of a logical one and a logical zero of the data;
receiving write data for a logical address associated with a first physical memory address within the first subarray of bitcells;
determining if the bitcells of the first physical memory address are all changed to the second state so that all bitcells of the first physical memory address exhibit the second state representing the other of a logical one and a logical zero;
if it is determined that the bitcells of the first physical memory address are all changed to the second state, writing write data into bitcells of the first physical memory address by changing first selected bitcells of the physical memory address from the second state back to the first state so that each first selected bitcell changed back to the first state represents the one of a logical one and a logical zero of the write data, said changing including directing spin-polarized current through the ferromagnetic device of first selected bitcells of the physical memory address, and by maintaining the state of second selected bitcells of the first physical memory address in the second state so that each second selected bitcell maintained in the second state represents the other of a logical one and a logical zero of the write data;

if it is determined that at least some of the bitcells of the first physical memory address are changed to the first state, determining if the bitcells of an available second physical memory address of the first subarray of bitcells are all changed to the second state so that all bitcells of the second physical memory address exhibit the second state representing the other of a logical one and a logical zero;

if it is determined that the bitcells of the available second physical memory address are all changed to the second state, invalidating the bitcells of the first physical memory address, allocating the second physical memory address to a logical memory address of the write data, and writing write data into bitcells of the second physical memory address by changing first selected bitcells of the second physical memory address from the second state back to the first state so that each first selected bitcell changed back to the first state represents the one of a logical one and a logical zero of the write data, said changing including directing spin-polarized current through the ferromagnetic device of first selected bitcells of the second physical memory address, and by maintaining the state of second selected bitcells of the second physical memory address in the second state so that each second selected bitcell maintained in the second state represents the other of a logical one and a logical zero of the write data;

if it is determined that there is no available second physical memory address of the first subarray of bitcells in which all bitcells of an available physical memory address are changed to the second state, selecting an available second subarray of bitcells in which all bitcells of the available second subarray of bitcells exhibit the second state representing the other of a logical one and a logical zero; and allocating a third physical memory address of the second subarray to the logical memory address of the write data, and writing write data into bitcells of the third physical memory address by changing first selected bitcells of the third physical memory address from the second state back to the first state so that each first selected bitcell changed back to the first state represents the one of a logical one and a logical zero of the write data, and by maintaining the state of second selected bitcells of the third physical memory address in the second state so that each second selected bitcell maintained in the second state represents the other of a logical one and a logical zero of the write data.

18. The method of claim 17 wherein said magnetic field directing includes generating the magnetic field using a coil disposed adjacent to the first subarray, wherein the first subarray of bitcells is arranged in a plane, wherein each ferromagnetic device of each bitcell of the first subarray has a ferromagnetic layer having a magnetization direction which is within the plane of the first subarray of bitcells, wherein said coil includes a plurality of turns, each of which is oriented one of:

substantially orthogonal to the plane of the first subarray of bitcells wherein said magnetic field directing includes directing the magnetic field in a direction substantially parallel to the plane and to the magnetization direction of the ferromagnetic layer of the ferromagnetic devices of the bitcells of the first subarray; and substantially parallel to the plane of the first subarray of bitcells wherein said magnetic field directing includes directing the magnetic field in a direction substantially orthogonal to the plane, and substantially parallel to the magnetization direction of the ferromagnetic layer of the ferromagnetic devices of the bitcells of the first subarray.

19. The method of claim 17 further comprising: transferring all valid data stored in the first subarray to the second subarray of bitcells and erasing data of bitcells of the first subarray, said erasing including said magnetic field-assisted changing of states of bitcells of the first subarray from the first state to the second state so that all bitcells of the first subarray exhibit the second state representing the other of a logical one and a logical zero.

* * * * *